(12) United States Patent
Kitagawa et al.

(10) Patent No.: US 10,983,391 B2
(45) Date of Patent: Apr. 20, 2021

(54) POLARIZING PLATE WITH RETARDATION LAYER AND IMAGE DISPLAY DEVICE

(71) Applicant: NITTO DENKO CORPORATION, Ibaraki (JP)

(72) Inventors: Takeharu Kitagawa, Ibaraki (JP); Hirofumi Katami, Ibaraki (JP); Shusaku Goto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/619,689

(22) PCT Filed: May 25, 2018

(86) PCT No.: PCT/JP2018/020166
§ 371 (c)(1),
(2) Date: Dec. 5, 2019

(87) PCT Pub. No.: WO2018/225542
PCT Pub. Date: Dec. 13, 2018

(65) Prior Publication Data
US 2020/0142255 A1    May 7, 2020

(30) Foreign Application Priority Data

Jun. 9, 2017 (JP) .............................. JP2017-114212

(51) Int. Cl.
*G02F 1/1335* (2006.01)
*G02B 5/30* (2006.01)
(Continued)

(52) U.S. Cl.
CPC ..... *G02F 1/133528* (2013.01); *G02B 5/3083* (2013.01); *G02F 1/133634* (2013.01);
(Continued)

(58) Field of Classification Search
CPC ......... G02F 1/133528; G02F 1/133634; G02F 2001/133637; G02F 2001/133638
See application file for complete search history.

(56) References Cited

U.S. PATENT DOCUMENTS 7,807,235 B2 * 10/2010 Kim ...................... G02B 5/3016
428/1.1
8,134,659 B2   3/2012 Takahashi et al.
(Continued)

FOREIGN PATENT DOCUMENTS

JP    2005-189645 A    7/2005
JP    2005-215461 A    8/2005
(Continued)

OTHER PUBLICATIONS

International Search Report dated Aug. 14, 2018, issued in counterpart International Application No. PCT/JP2018/020166 (2 pages).
(Continued)

*Primary Examiner* — Dung T Nguyen
(74) *Attorney, Agent, or Firm* — Westerman, Hattori, Daniels & Adrian, LLP

(57) ABSTRACT

There is provided a polarizing plate with a retardation layer that can achieve an image display apparatus having excellent durability and excellent weatherability, and having an excellent hue. A polarizing plate with a retardation layer according to an embodiment of the present invention includes in this order: a polarizing plate including a protective layer and a polarizer; a retardation layer; and a pressure-sensitive adhesive layer. The protective layer has a light transmittance at a wavelength of 380 nm of 10% or less. The polarizing plate has a light transmittance at a wavelength of 380 nm of 5% or less. The pressure-sensitive adhesive layer has a light transmittance at a wavelength of 405 nm of 5% or less. The
(Continued)

polarizing plate with a retardation layer has a light transmittance at a wavelength of 405 nm of 3% or less.

14 Claims, 5 Drawing Sheets

(51) Int. Cl.
*G02F 1/13363* (2006.01)
*C09J 7/29* (2018.01)
(52) U.S. Cl.
CPC ..... *C09J 7/29* (2018.01); *G02F 2001/133637* (2013.01); *G02F 2001/133638* (2013.01)

(56) References Cited

U.S. PATENT DOCUMENTS

| | | | |
|---|---|---|---|
| 8,730,441 | B2 | 5/2014 | Yoshihara |
| 2011/0063547 | A1 | 3/2011 | Takahashi et al. |
| 2012/0249942 | A1 | 10/2012 | Yoshihara |
| 2014/0153086 | A1* | 6/2014 | Cao .................. G02B 1/041 359/356 |
| 2015/0146294 | A1 | 5/2015 | Watanabe |
| 2019/0107657 | A1* | 4/2019 | Jung .................. B32B 27/306 |

FOREIGN PATENT DOCUMENTS

| | | |
|---|---|---|
| JP | 2012-198282 A | 10/2012 |
| WO | 2004/033545 A1 | 4/2004 |
| WO | 2009/150779 A1 | 12/2009 |
| WO | 2011/074276 A1 | 6/2011 |
| WO | 2013/175767 A1 | 11/2013 |
| WO | 2014/185318 A1 | 11/2014 |
| WO | 2017/094553 A1 | 6/2017 |
| WO | 2017/110332 A1 | 6/2017 |

OTHER PUBLICATIONS

Office Action dated Jan. 5, 2021, issued in counterpart JP Application No. 2017-114212, with English Translation. (8 pages).

* cited by examiner

POLARIZING PLATE WITH RETARDATION LAYER AND IMAGE DISPLAY DEVICE

TECHNICAL FIELD

The present invention relates to a polarizing plate with a retardation layer and an image display apparatus using the same.

BACKGROUND ART

In recent years, image display apparatus typified by a liquid crystal display apparatus and an organic EL display apparatus have been rapidly gaining more widespread use. In the image display apparatus, a polarizing plate and a retardation plate are typically used. In practical use, a polarizing plate with a retardation layer, in which the polarizing plate and the retardation plate are integrated, is widely used (for example, Patent Literature 1). In this connection, recently, along with an increasing demand for thinning of the image display apparatus, there has also been an increasing demand for thinning of the polarizing plate with a retardation layer.

Incidentally, the image display apparatus (especially the organic EL display apparatus) involves a problem in that its characteristics deteriorate with time owing to UV light (its weatherability is insufficient). A technology involving imparting a UV-absorbing ability to an optical film to be used in the image display apparatus has been investigated for improving the durability of the image display apparatus. However, the technology involves a problem in that the hue of the apparatus changes, and hence desired display characteristics are not obtained.

CITATION LIST

Patent Literature

[PTL 1] JP 2005-189645 A

SUMMARY OF INVENTION

Technical Problem

The present invention has been made to solve the conventional problems, and a primary object of the present invention is to provide a polarizing plate with a retardation layer that can achieve an image display apparatus having excellent durability and excellent weatherability, and having an excellent hue.

Solution to Problem

A polarizing plate with a retardation layer according to an embodiment of the present invention includes in this order: a polarizing plate including a protective layer and a polarizer; a retardation layer; and a pressure-sensitive adhesive layer. The protective layer has a light transmittance at a wavelength of 380 nm of 10% or less. The polarizing plate has a light transmittance at a wavelength of 380 nm of 5% or less. The pressure-sensitive adhesive layer has a light transmittance at a wavelength of 405 nm of 5% or less. The polarizing plate with a retardation layer has a light transmittance at a wavelength of 405 nm of 3% or less.

In one embodiment of the present invention, the retardation layer includes a polycarbonate-based resin film. In one embodiment of the present invention, the polarizing plate with a retardation layer further includes another retardation layer between the retardation layer and the pressure-sensitive adhesive layer.

In one embodiment of the present invention, the retardation layer includes an alignment fixed layer of a liquid crystal compound. In one embodiment of the present invention, the retardation layer has a laminated structure of a first alignment fixed layer of a liquid crystal compound and a second alignment fixed layer of a liquid crystal compound.

In one embodiment of the present invention, the polarizer has a thickness of 10 μm or less.

In one embodiment of the present invention, the protective layer has a thickness of 30 μm or less.

In one embodiment of the present invention, the protective layer has a moisture permeability of 20 g/m²·24 h or less.

In one embodiment of the present invention, the polarizing plate and the retardation layer are directly laminated.

In one embodiment of the present invention, the polarizing plate has a reflection hue value b* of −1.5 or less.

In one embodiment of the present invention, the polarizer has a crossed hue value "b" of −1.5 or less.

In one embodiment of the present invention, the polarizing plate with a retardation layer further includes a conductive layer or an isotropic substrate with a conductive layer between the retardation layer and the pressure-sensitive adhesive layer.

According to another aspect of the present invention, there is provided an image display apparatus. The image display apparatus includes the polarizing plate with a retardation layer as described above.

Advantageous Effects of Invention

According to the present invention, in the polarizing plate with a retardation layer, the light transmittances of the protective layer, the polarizing plate, the pressure-sensitive adhesive layer, and the polarizing plate with a retardation layer at predetermined wavelengths are controlled. Accordingly, the polarizing plate with a retardation layer that can achieve an image display apparatus having excellent durability and excellent weatherability, and having an excellent hue can be obtained.

DESCRIPTION OF EMBODIMENTS

Embodiments of the present invention are described below. However, the present invention is not limited to these embodiments.

Definitions of Terms and Symbols

The definitions of terms and symbols used herein are as described below.
(1) Refractive Indices (nx, ny, and nz)
"nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.
(2) In-Plane Retardation (Re)
"Re($\lambda$)" refers to an in-plane retardation measured at 23° C. with light having a wavelength of $\lambda$ nm. For example, "Re(550)" refers to an in-plane retardation measured at 23° C. with light having a wavelength of 550 nm. The Re($\lambda$) is determined from the equation "Re ($\lambda$)=(nx−ny)×d" when the thickness of a layer (film) is represented by d (nm).
(3) Thickness Direction Retardation (Rth)
"Rth($\lambda$)" refers to a thickness direction retardation measured at 23° C. with light having a wavelength of $\lambda$ nm. For example, "Rth(550)" refers to a thickness direction retardation measured at 23° C. with light having a wavelength of 550 nm. The Rth($\lambda$) is determined from the equation "Rth ($\lambda$)=(nx−nz)×d" when the thickness of a layer (film) is represented by d (nm).
(4) Nz Coefficient
An Nz coefficient is determined from the equation "Nz=Rth/Re".

A. Overall Configuration of Polarizing Plate with Retardation Layer

Figure 1:
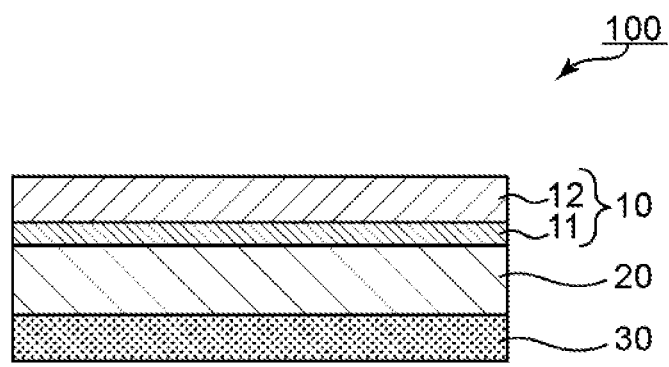
FIG. 1 is a schematic sectional view of a polarizing plate with a retardation layer according to one embodiment of the present invention.

FIG. 1 is a schematic sectional view of a polarizing plate with a retardation layer according to one embodiment of the present invention. A polarizing plate 100 with a retardation layer of this embodiment includes, in this order, a polarizing plate 10, a retardation layer 20, and a pressure-sensitive adhesive layer 30. The polarizing plate 10 includes a polarizer 11 and a protective layer 12 arranged on one side of the polarizer 11 (typically a side opposite to the retardation layer 20). Another protective layer (not shown) may be arranged on the other side of the polarizer (typically the retardation layer 20 side) as required.

Figure 2:
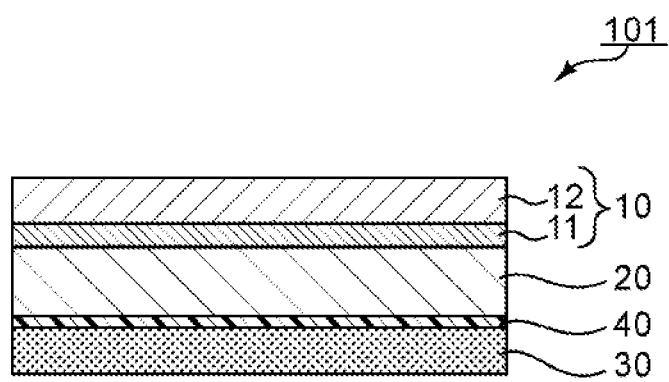
FIG. 2 is a schematic sectional view of a polarizing plate with a retardation layer according to another embodiment of the present invention.

In one embodiment, the retardation layer 20 includes a resin film. In this embodiment, as illustrated in FIG. 2, a polarizing plate 101 with a retardation layer may further include another retardation layer 40 between the retardation layer 20 and the pressure-sensitive adhesive layer 30. In the following descriptions, for convenience, the retardation layer 20 is sometimes referred to as "first retardation layer", and the other retardation layer 40 is sometimes referred to as "second retardation layer".

Figure 3:
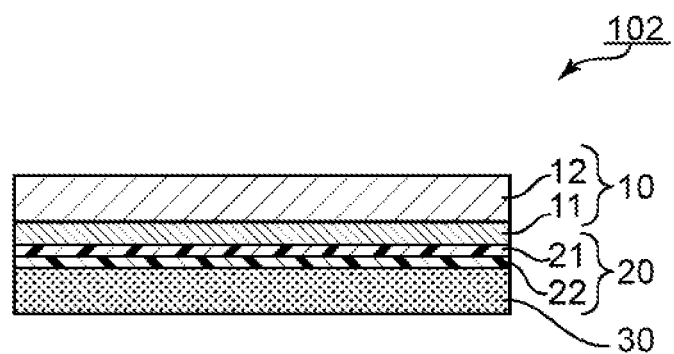
FIG. 3 is a schematic sectional view of a polarizing plate with a retardation layer according to still another embodiment of the present invention.

In another embodiment, the first retardation layer 20 may be an alignment fixed layer of a liquid crystal compound. In this embodiment, the first retardation layer 20 may be a single layer, or may have such a laminated structure of a first alignment fixed layer 21 and a second alignment fixed layer 22 as illustrated in FIG. 3.

Figure 4:
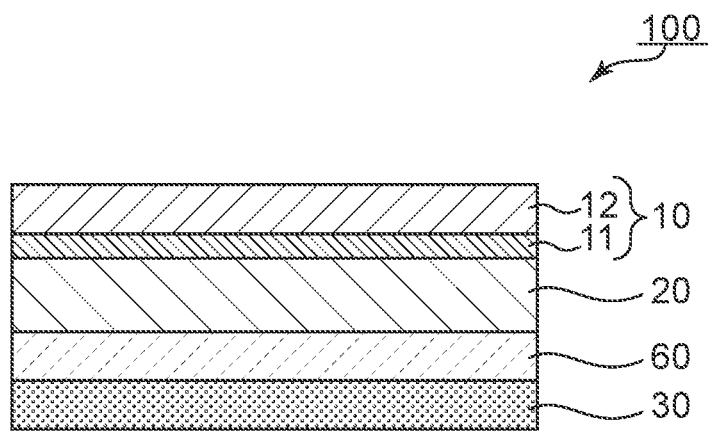
FIG. 4 is a schematic sectional view of a polarizing plate with a retardation layer according to still another embodiment of the present invention.
Figure 5:
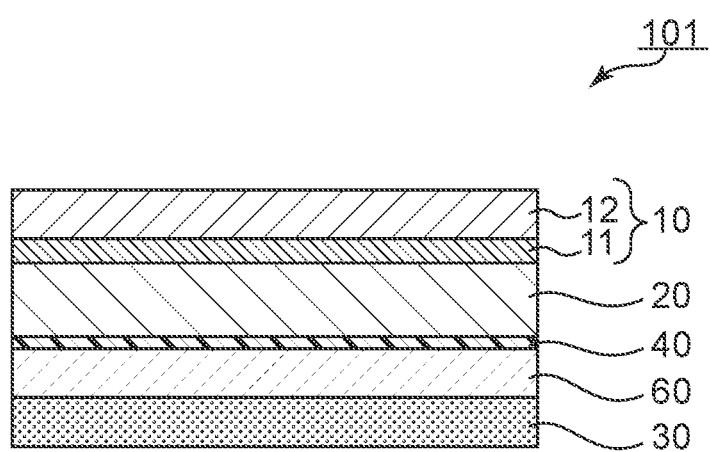
FIG. 5 is a schematic sectional view of a polarizing plate with a retardation layer according to still another embodiment of the present invention.
Figure 6:
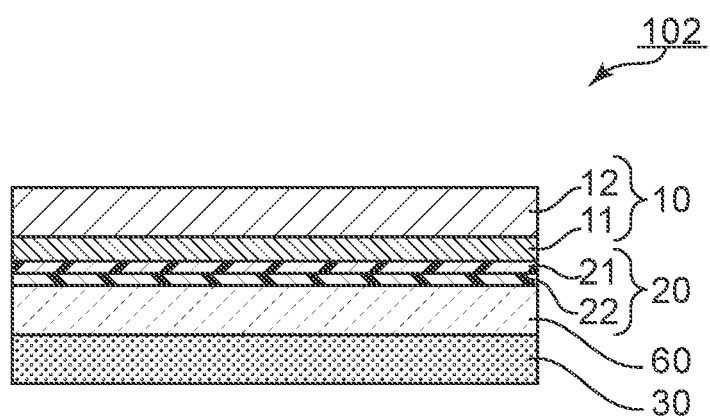
FIG. 6 is a schematic sectional view of a polarizing plate with a retardation layer according to still another embodiment of the present invention.

A conductive layer or an isotropic substrate with a conductive layer 60 (FIGS. 4-6) may be arranged as required. The conductive layer or the isotropic substrate with a conductive layer 60 is typically arranged on the side of the retardation layer 20 opposite to the polarizing plate 10, more specifically between the retardation layer 20 (when the second retardation layer 40 is present, the second retardation layer 40) and the pressure-sensitive adhesive layer 30. When the conductive layer or the isotropic substrate with a conductive layer is arranged, the polarizing plate with a retardation layer may be applied to a so-called inner touch panel-type input display apparatus obtained by incorporating a touch sensor between a display cell (e.g., an organic EL cell) and a polarizing plate.

In one embodiment, the polarizing plate 10 (in the illustrated example, the polarizer 11) and the retardation layer are directly laminated. With such configuration, further thinning of the polarizing plate with a retardation layer (consequently an image display apparatus) can be achieved. The phrase "directly laminated" as used herein refers to a state in which the polarizing plate and the retardation layer are laminated only with an adhesive or a pressure-sensitive adhesive without an intermediate layer being interposed. Further, the phrase "directly laminated" encompasses a state in which the polarizing plate and the retardation layer are literally directly laminated without the use of even the adhesive or the pressure-sensitive adhesive.

In the embodiment of the present invention, the light transmittance of the protective layer 12 at a wavelength of 380 nm is 10% or less, preferably 9% or less, more preferably 8.7% or less. The light transmittance of the polarizing plate 10 at a wavelength of 380 nm is 5% or less, preferably 3% or less, more preferably 2% or less. The light transmittance of the pressure-sensitive adhesive layer 30 at a wavelength of 405 nm is 5% or less, preferably 3% or less, more preferably 1% or less. Further, the light transmittance of the polarizing plate with a retardation layer at a wavelength of 405 nm is 3% or less, preferably 2.5% or less, more preferably 2% or less. The light transmittances may be measured with a spectrophotometer in conformity with JIS K0115. In one embodiment, the reflection hue value b* of the polarizing plate 10 is preferably −1.5 or less, more preferably −1.9 or less. In one embodiment, the crossed hue value "b" of the polarizer 11 is preferably −1.5 or less, more preferably −2.5 or less. According to the embodiment of the present invention, as described above, both of extremely excellent UV absorbability and an extremely excellent hue can be achieved. As a result, the polarizing plate with a retardation layer of the present invention can achieve an image display apparatus (especially an organic EL display apparatus) excellent both in weatherability and in hue.

The total thickness of the polarizing plate with a retardation layer is preferably 140 µm or less, more preferably 120 µm or less, still more preferably 110 µm or less. The lower limit of the total thickness is, for example, 60 µm. In an embodiment in which the retardation layer is an alignment fixed layer of a liquid crystal compound, the total thickness is preferably 60 µm or less, more preferably 55 µm or less. The lower limit of the total thickness in this embodiment is, for example, 35 µm. According to the present invention, in addition to such achievement of both of the extremely excellent UV absorbability and the extremely excellent hue as described above, significant thinning of the polarizing plate with a retardation layer can be achieved. The total thickness of the polarizing plate with a retardation layer refers to the total of the thicknesses of the protective layer 12, the polarizer 11, the retardation layer 20 (and, if present, the second retardation layer 40), and an adhesion layer (an adhesive layer or a pressure-sensitive adhesive layer) for laminating the layers, and the pressure-sensitive adhesive layer 30.

The polarizing plate with a retardation layer may be of a sheet shape, or may be of an elongate shape. The term "elongate" as used herein means a long and narrow shape whose length is sufficiently long as compared to its width, and includes, for example, a long and narrow shape whose length is 10 or more times, preferably 20 or more times as long as its width. The polarizing plate with a retardation layer of an elongate shape can be wound in a roll shape.

In practical use, it is preferred that a release film be temporarily bonded to the surface of the pressure-sensitive adhesive layer 30 until the polarizing plate with a retardation layer is used. The temporary bonding of the release film protects the pressure-sensitive adhesive layer and enables the formation of a roll.

The respective layers, an optical film, and a pressure-sensitive adhesive constituting the polarizing plate with a retardation layer are described in more detail below.

B. Polarizing Plate
B-1. Polarizer

Any appropriate polarizer may be adopted as the polarizer 11. For example, a resin film forming the polarizer may be a single-layer resin film, or may be a laminate of two or more layers.

Specific examples of the polarizer including a single-layer resin film include: a polarizer obtained by subjecting a hydrophilic polymer film, such as a polyvinyl alcohol (PVA)-based film, a partially formalized PVA-based film, or an ethylene-vinyl acetate copolymer-based partially saponified film, to dyeing treatment with a dichroic substance, such as iodine or a dichroic dye, and stretching treatment; and a polyene-based alignment film, such as a dehydration-treated product of PVA or a dehydrochlorination-treated product of polyvinyl chloride. A polarizer obtained by dyeing the PVA-based film with iodine and uniaxially stretching the resultant is preferably used because the polarizer is excellent in optical characteristics.

The dyeing with iodine is performed by, for example, immersing the PVA-based film in an aqueous solution of iodine. The stretching ratio of the uniaxial stretching is preferably from 3 times to 7 times. The stretching may be performed after the dyeing treatment, or may be performed while the dyeing is performed. In addition, the dyeing may be performed after the stretching has been performed. The PVA-based film is subjected to swelling treatment, cross-linking treatment, washing treatment, drying treatment, or the like as required. For example, when the PVA-based film is immersed in water to be washed with water before the dyeing, contamination or an antiblocking agent on the surface of the PVA-based film can be washed off. In addition, the PVA-based film is swollen and hence dyeing unevenness or the like can be prevented.

The polarizer obtained by using the laminate is specifically, for example, a polarizer obtained by using a laminate of a resin substrate and a PVA-based resin layer (PVA-based resin film) laminated on the resin substrate, or a laminate of a resin substrate and a PVA-based resin layer formed on the resin substrate through application. The polarizer obtained by using the laminate of the resin substrate and the PVA-based resin layer formed on the resin substrate through application may be produced by, for example, a method involving: applying a PVA-based resin solution onto the resin substrate; drying the solution to form the PVA-based resin layer on the resin substrate, to thereby provide the laminate of the resin substrate and the PVA-based resin layer; and stretching and dyeing the laminate to turn the PVA-based resin layer into the polarizer. In this embodiment, the stretching typically includes the stretching of the laminate under a state in which the laminate is immersed in an aqueous solution of boric acid. The stretching may further include the aerial stretching of the laminate at high temperature (e.g., 95° C. or more) before the stretching in the aqueous solution of boric acid as required. The resultant laminate of the resin substrate and the polarizer may be used as it is (i.e., the resin substrate may be used as a protective layer for the polarizer). Alternatively, a product obtained as described below may be used: the resin substrate is peeled from the laminate of the resin substrate and the polarizer, and any appropriate protective layer in accordance with purposes is laminated on the peeling surface. Details about such method of producing a polarizer are described in, for example, JP2012-73580A. The entire description of the laid-open publication is incorporated herein by reference.

The thickness of the polarizer is preferably 10 μm or less, more preferably 8 μm or less, still more preferably 6 μm or less, particularly preferably 5 μm or less. The lower limit of the thickness of the polarizer is, for example, 1 μm. When the thickness of the polarizer falls within such range, a polarizing plate with a retardation layer can be made thin. Further, in the polarizing plate with a retardation layer, both an excellent UV absorbing ability and an excellent hue can be achieved. In addition, when the thickness of the polarizer falls within such range, curling at the time of heating can be satisfactorily suppressed, and satisfactory appearance durability at the time of heating is obtained.

The boric acid content of the polarizer is preferably 18 wt % or more, more preferably from 18 wt % to 25 wt %. When the boric acid content of the polarizer falls within such range, by a synergistic effect with an iodine content to be described later, the appearance durability of the polarizing plate at the time of its heating can be improved while the ease with which the curling thereof at the time of its bonding is adjusted is satisfactorily maintained, and the curling thereof at the time of the heating is satisfactorily suppressed. The boric acid content may be calculated, for example, as the amount of boric acid contained per unit weight of the polarizer through the use of the following expression on the basis of a neutralization method.

$$\{(\text{Dropping amount (mL) of aqueous solution of NaOH} \times \text{concentration (mol/L) of aqueous solution of NaOH} \times 10^{-3})/\text{weight (g) of polarizer}\} \times \text{molecular weight (g/mol) of boric acid} \times 100$$

The iodine content of the polarizer is preferably 2.1 wt % or more, more preferably from 2.1 wt % to 3.5 wt %. When the iodine content of the polarizer falls within such range, by a synergistic effect with the boric acid content, the appearance durability of the polarizing plate at the time of its heating can be improved while the ease with which the curling thereof at the time of its bonding is adjusted is satisfactorily maintained, and the curling thereof at the time of the heating is satisfactorily suppressed. The term "iodine content" as used herein means the amount of all iodine contained in the polarizer (PVA-based resin film). More specifically, in the polarizer, iodine is present in the forms of an iodide ion ($I^-$), an iodine molecule ($I_2$), polyiodide ions ($I_3^-$ and $I_5^-$), and the like, and the term "iodine content" as used herein means the amount of iodine encompassing all of those forms. The iodine content may be calculated by, for example, a calibration curve method for X-ray fluorescence analysis. The polyiodide ions are each present in a state of forming a PVA-iodine complex in the polarizer. Through the formation of such complex, absorption dichroism can be expressed in the wavelength range of visible light. Specifically, a complex of PVA and a triiodide ion ($PVA \cdot I_3^-$) has an absorption peak around 470 nm, and a complex of PVA and a pentaiodide ion (PVA·$I_5^-$) has an absorption peak around 600 nm. As a result, the polyiodide ions can absorb light in a wide range of visible light depending on their forms. Meanwhile, the iodide ion ($I^-$) has an absorption peak around 230 nm, and is not substantially involved in the absorption of visible light. Therefore, the polyiodide ions each present in a state of a complex with PVA can be mainly involved in the absorption performance of the polarizer.

The polarizer preferably shows absorption dichroism at any wavelength in the wavelength range of from 380 nm to 780 nm. The single layer transmittance of the polarizer is from 43.0% to 46.0%, preferably from 44.5% to 46.0%. The polarization degree of the polarizer is preferably 97.0% or more, more preferably 99.0% or more, still more preferably 99.9% or more.

As described above, the crossed hue value "b" of the polarizer is preferably −1.5 or less, more preferably −2.5 or less. In addition, as described above, the reflection hue value b* of the polarizing plate (laminate of the polarizer and the protective layer to be described later) is preferably −1.5 or less, more preferably −1.9 or less. When the value "b" and the value b* fall within such ranges, in the case where the polarizing plate with a retardation layer is applied to an image display apparatus, an excellent hue can be achieved. Further, as described above, the light transmittance of the polarizing plate at a wavelength of 380 nm is 5% or less, preferably 3% or less, more preferably 2% or less.

B-2. Protective Layer

As described above, the light transmittance of the protective layer 12 at a wavelength of 380 nm is 10% or less, preferably 9% or less, more preferably 8.7% or less. When the protective layer 12 has such transmittance, UV light is cut off by the polarizing plate with a retardation layer in an extremely satisfactory manner. As a result, when the polarizing plate with a retardation layer is applied to an image display apparatus, extremely excellent weatherability can be achieved.

The moisture permeability of the protective layer 12 is preferably 20 g/m$^2$·24 h or less, more preferably 15 g/m$^2$·24 h or less, still more preferably 12 g/m$^2$·24 h or less. When the moisture permeability of the protective layer falls within such range, even in the case of such an extremely thin polarizer as described above, its durability can be secured. As a result, the durability of the polarizing plate with a retardation layer becomes excellent, and hence the weatherability of the image display apparatus can be made extremely excellent by a synergistic effect of the excellent durability and the excellent UV absorbability.

Any appropriate configuration and material may be adopted for the protective layer 12 as long as the layer satisfies such characteristics as described above. For example, the protective layer may be a single layer, or may have a laminated structure. In one embodiment, the protective layer may be a single layer having a UV-absorbing ability. In another embodiment, the protective layer may be a laminate having an inner layer having a UV-absorbing ability and outer layers arranged on both sides of the inner layer. A case in which the protective layer is the laminate is described below. The single layer may correspond to the inner layer of the laminate.

As described above, the laminate has the inner layer and the outer layers arranged on both sides of the inner layer. Typically, only the inner layer has a UV-absorbing ability. Any appropriate resin may be adopted as a resin forming each of the inner layer and the outer layers. The resin is preferably a cyclic olefin-based resin. This is because, in the case where a film is formed, the film has a desired moisture permeability, and even when a UV-absorbing ability is imparted thereto, the other characteristics of the film are not adversely affected.

The cyclic olefin-based resin is a generic name for resins each polymerized by using a cyclic olefin as a polymerization unit, and examples thereof include resins described in JP 01-240517 A, JP 03-14882 A, JP 03-122137 A, and the like. Specific examples thereof include a ring-opened (co) polymer of a cyclic olefin, a polymer obtained by the addition polymerization of a cyclic olefin, a copolymer (typically a random copolymer) of a cyclic olefin and an α-olefin, such as ethylene or propylene, a graft-modified polymer obtained by modifying the polymer with an unsaturated carboxylic acid or a derivative thereof, and a hydrogenated product thereof. A specific example of the cyclic olefin is a norborene-based monomer. Examples of the norbornene-based monomer include: norbornene, alkyl- and/or alkylidene-substituted products thereof, such as 5-methyl-2-norbornene, 5-dimethyl-2-norbornene, 5-ethyl-2-norbornene, 5-butyl-2-norbornene, and 5-ethylidene-2-norbornene, and polar group- (such as halogen-) substituted products thereof; dicyclopentadiene and 2,3-dihydrodicyclopentadiene; dimethanooctahydronaphthalene, alkyl- and/ or alkylidene-substituted products thereof, and polar group- (such as halogen-) substituted products thereof, such as 6-methyl-1,4:5,8-dimethano-1,4,4a,5,6,7,8,8a-octahydronaphthalene, 6-ethyl-1,4:5,8-dimethano-1,4,4a,5,6,7,8, 8a-octahydronaphthalene, 6-ethylidene-1,4:5,8-dimethano-1,4,4a,5,6,7,8,8a-octahydronaphthalene, 6-chloro-1,4:5,8-dimethano-1,4,4a,5,6,7,8,8a-octahydronaphthalene, 6-cyano-1,4:5,8-dimethano-1,4,4a,5,6,7,8,8a-octahydronaphthalene, 6-pyridyl-1,4:5,8-dimethano-1,4,4a,5,6,7, 8,8a-octahydronaphthalene, and 6-methoxycarbonyl-1,4:5, 8-dimethano-1,4,4a,5,6,7,8,8a-octahydronaphthalene; a trimer and a tetramer of cyclopentadiene, such as 4,9:5,8-dimethano-3a,4,4a,5,8,8a,9,9a-octahydro-1H-benzoindene and 4,11:5,10:6,9-trimethano-3a,4,4a,5,5a,6,9,9a,10,10a,11, 11a-dodecahydro-1H-cyclopentaanthracene.

In the present invention, any other cycloolefin that may be subjected to ring-opening polymerization may be used in combination with the cycloolefin to the extent that the object of the present invention is not impaired. Specific examples of such cycloolefin include compounds each having one reactive double bond, such as cyclopentene, cyclooctene, and 5,6-dihydrodicyclopentadiene.

The number-average molecular weight (Mn) of the cyclic olefin-based resin, which is measured by a gel permeation chromatograph (GPC) method with a toluene solvent, is preferably from 5,000 to 200,000, more preferably from 8,000 to 100,000, still more preferably from 10,000 to 80,000, particularly preferably from 20,000 to 50,000. When the number-average molecular weight falls within the range, a resin film being excellent in mechanical strength and having satisfactory solubility, formability, and flow-casting operability can be obtained.

When the cyclic olefin-based resin is obtained by hydrogenating a ring-opened polymer of a norbornene-based monomer, a hydrogenation rate is preferably 90% or more, more preferably 95% or more, most preferably 99% or more. When the hydrogenation rate falls within such range, the resin is excellent in, for example, heat deterioration resistance and light deterioration resistance.

Any appropriate method may be adopted as a method of imparting a UV-absorbing ability to the inner layer. The UV-absorbing ability is typically imparted by compounding the layer with a UV absorber. Any appropriate UV absorber may be used as the UV absorber. Specific examples thereof include a benzophenone-based UV absorber, a benzotriazole-based UV absorber, and an acrylonitrile-based UV absorber. Preferred examples thereof include 2,2'-methylenebis(4-(1,1,3,3-tetramethylbutyl)-6-(2H-benzotriazol-2-yl)phenol), 2-(2'-hydroxy-3'-tert-butyl-5'-methylphenyl)-5-chlorobenzotriazole, 2,4-di-tert-butyl-6-(5-chlorobenzotriazol-2-yl)phenol, 2,2'-dihydroxy-4,4'-dimethoxybenzophenone, and 2,2',4,4'-tetrahydroxybenzophenone. A more preferred example thereof is 2,2'-methylenebis(4-(1,1,3,3-tetramethylbutyl)-6-(2H-benzotriazol-2-yl)phenol). The content of the UV absorber in the inner layer is preferably from 5 wt % to 10 wt %, more preferably from 6.5 wt % to 9.5 wt %. When the content falls within such range, the light transmittance of the protective layer at a wavelength of 380 nm can be set within a desired range, and undesired coloring of the protective layer (consequently the polarizing plate with a retardation layer) can be suppressed.

Irrespective of whether the protective layer 12 is a single layer or a laminate, its thickness is preferably 30 μm or less, more preferably 25 μm or less. The lower limit of the thickness of the protective layer is, for example, 10 μm. According to the present invention, despite the fact that both of the polarizer and the protective layer are extremely thin, the durability of the polarizer can be secured. As a result, both of significant thinning and excellent durability in the polarizing plate with a retardation layer (consequently the image display apparatus) can be achieved. When the protective layer is subjected to surface treatment to be described later, its thickness is a thickness including the thickness of a surface-treated layer.

As described later, the polarizing plate with a retardation layer of the present invention is typically arranged on the viewer side of an image display apparatus, and the protective layer 12 is typically arranged on its viewer side. Therefore, the protective layer 12 may be subjected to surface treatment, such as hard coat treatment, antireflection treatment, anti-sticking treatment, or antiglare treatment, as required. Further/alternatively, the protective layer 12 may be subjected to treatment for improving viewability when the display screen of the apparatus is viewed through polarized sunglasses (typically the impartment of a circular (elliptical) polarization function or the impartment of an ultra-high retardation) as required. When such treatment is performed, even in the case where the display screen is viewed through a polarizing lens, such as polarized sunglasses, excellent viewability can be achieved. Therefore, the polarizing plate with a retardation layer is suitably applicable even to an image display apparatus that may be used outdoors.

C. First Retardation Layer

C-1. Characteristics of First Retardation Layer

The first retardation layer 20 may have any appropriate optical characteristics and/or mechanical characteristics depending on purposes. The first retardation layer 20 typically has a slow axis. In one embodiment, an angle θ formed by the slow axis of the first retardation layer 20 and the absorption axis of the polarizer 11 is preferably from 38° to 52°, more preferably from 42° to 48°, still more preferably about 45°. When the angle θ falls within such range, through the use of the first retardation layer as a λ/4 plate as described later, a polarizing plate with a retardation layer having an extremely excellent circular polarization characteristic (consequently an extremely excellent antireflection characteristic) can be obtained.

The first retardation layer preferably has a refractive index characteristic of showing a relationship of nx>ny≥nz. The first retardation layer is typically arranged in order to impart an antireflection characteristic to the polarizing plate, and in one embodiment, may function as a λ/4 plate. In this case, the in-plane retardation Re(550) of the first retardation layer is preferably from 80 nm to 200 nm, more preferably from 100 nm to 180 nm, still more preferably from 110 nm to 170 nm. Herein, "ny=nz" encompasses not only a case in which ny and nz are exactly equal to each other, but also a case in which ny and nz are substantially equal to each other. Therefore, a relationship of ny<nz may be satisfied without impairing the effects of the present invention.

The Nz coefficient of the first retardation layer is preferably from 0.9 to 3, more preferably from 0.9 to 2.5, still more preferably from 0.9 to 1.5, particularly preferably from 0.9 to 1.3. When such relationship is satisfied, in the case of using the polarizing plate with a retardation layer to be obtained for an image display apparatus, an extremely excellent reflection hue can be achieved.

The first retardation layer may show a reverse wavelength dispersion characteristic, i.e., a retardation value increasing with an increase in wavelength of measurement light, may show a positive wavelength dispersion characteristic, i.e., a retardation value decreasing with an increase in wavelength of measurement light, or may show a flat wavelength dispersion characteristic, i.e., a retardation value hardly changing even when the wavelength of measurement light changes. In one embodiment, the first retardation layer shows a reverse wavelength dispersion characteristic. In this case, the retardation layer has an Re(450)/Re(550) of preferably 0.8 or more and less than 1, more preferably 0.8 or more and 0.95 or less. With such configuration, an extremely excellent antireflection characteristic can be achieved.

The first retardation layer contains a resin having an absolute value of its photoelastic coefficient of preferably $2 \times 10^{-11}$ $m^2/N$ or less, more preferably from $2.0 \times 10^{-13}$ $m^2/N$ to $1.5 \times 10^{-11}$ $m^2/N$, still more preferably from $1.0 \times 10^{-12}$ $m^2/N$ to $1.2 \times 10^{-11}$ $m^2/N$. When the absolute value of the photoelastic coefficient falls within such range, a retardation change is less liable to be generated in the case where a shrinkage stress is generated at the time of heating. As a result, heat unevenness in an image display apparatus to be obtained can be satisfactorily prevented.

C-2. First Retardation Layer Including Resin Film

When the first retardation layer includes a resin film, its thickness is preferably 60 μm or less, more preferably from 30 μm to 55 μm. When the thickness of the first retardation layer falls within such range, the curling of the layer at the time of its bonding can be satisfactorily adjusted while the curling thereof at the time of its heating is satisfactorily suppressed.

The first retardation layer 20 may include any appropriate resin film that may satisfy the characteristics described in the section C-1. Typical examples of such resin include a cyclic olefin-based resin, a polycarbonate-based resin, a cellulose-based resin, a polyester-based resin, a polyvinyl alcohol-based resin, a polyamide-based resin, a polyimide-based resin, a polyether-based resin, a polystyrene-based resin, and an acrylic resin. When the first retardation layer includes a resin film showing a reverse wavelength dispersion characteristic, the polycarbonate-based resin may be suitably used.

Any appropriate polycarbonate resin may be used as the polycarbonate-based resin as long as the effects of the present invention are exhibited. The polycarbonate resin preferably has a structural unit derived from a fluorene-based dihydroxy compound, a structural unit derived from an isosorbide-based dihydroxy compound, and a structural unit derived from at least one dihydroxy compound selected from the group consisting of an alicyclic diol, an alicyclic dimethanol, a di, tri, or polyethyleneglycol, and an alkylene glycol or a spiroglycol. The polycarbonate resin preferably has a structural unit derived from a fluorene-based dihydroxy compound, a structural unit derived from an isosorbide-based dihydroxy compound, and a structural unit derived from an alicyclic dimethanol and/or a structural unit derived from a di, tri, or polyethylene glycol, and more preferably has a structural unit derived from a fluorene-based dihydroxy compound, a structural unit derived from an isosorbide-based dihydroxy compound, and a structural unit derived from a di, tri, or polyethylene glycol. The polycarbonate resin may have a structural unit derived from any other dihydroxy compound as required. Details about the polycarbonate resin that may be suitably used in the present invention are described, for example, in JP 2014-10291 A or JP 2014-26266 A, the description of which is incorporated herein by reference.

The glass transition temperature of the polycarbonate resin is preferably 110° C. or more and 150° C. or less, more preferably 120° C. or more and 140° C. or less. When the glass transition temperature is excessively low, the heat resistance of the resin tends to deteriorate and hence the resin may cause a dimensional change after its forming into a film. In addition, the image quality of an organic EL panel to be obtained may deteriorate. When the glass transition temperature is excessively high, the forming stability of the resin at the time of its forming into a film may deteriorate. In addition, the transparency of the film may be impaired. The glass transition temperature is determined in conformity to JIS K 7121 (1987).

The molecular weight of the polycarbonate resin may be expressed as a reduced viscosity. The reduced viscosity is measured with an Ubbelohde viscometer at a temperature of 20.0° C.±0.1° C. after precise adjustment of a polycarbonate concentration to 0.6 g/dL through the use of methylene chloride as a solvent. The lower limit of the reduced viscosity is generally preferably 0.30 dL/g, more preferably 0.35 dL/g. The upper limit of the reduced viscosity is generally preferably 1.20 dL/g, more preferably 1.00 dL/g, still more preferably 0.80 dL/g. When the reduced viscosity is lower than the lower limit value, there may arise a problem of a reduction in mechanical strength of a formed article. Meanwhile, when the reduced viscosity is higher than the upper limit value, there may arise a problem in that fluidity during forming is decreased to decrease productivity and formability.

A commercially available film may be used as a polycarbonate-based resin film. Specific examples of the commercially available product include products available under the product names "PURE-ACE WR-S", "PURE-ACE WR-W", and "PURE-ACE WR-M" from Teijin Limited, and a product available under the product name "NRF" from Nitto Denko Corporation.

The first retardation layer 20 is obtained by, for example, stretching a film formed from the polycarbonate-based resin. Any appropriate forming method may be adopted as a method of forming a film from the polycarbonate-based resin. Specific examples thereof include a compression molding method, a transfer molding method, an injection molding method, an extrusion method, a blow molding method, a powder forming method, a FRP molding method, a cast coating method (such as a casting method), a calender method, and a hot-press method. Of those, an extrusion method or a cast coating method is preferred. This is because the extrusion method or the cast coating method can increase the smoothness of the film to be obtained and provide satisfactory optical uniformity. Forming conditions may be appropriately set depending on, for example, the composition and kind of the resin to be used, and the desired characteristics of the retardation layer. As described above, for the polycarbonate-based resin, many film products are commercially available, and hence the commercially available films may each be subjected to stretching treatment.

The thickness of the resin film (unstretched film) may be set to any appropriate value depending on, for example, the desired thickness and desired optical characteristics of the first retardation layer, and stretching conditions to be described later. The thickness is preferably from 50 μm to 300 μm.

Any appropriate stretching method and stretching conditions (such as a stretching temperature, a stretching ratio, and a stretching direction) may be adopted for the stretching. Specifically, one kind of various stretching methods, such as free-end stretching, fixed-end stretching, free-end shrinkage, and fixed-end shrinkage, may be employed alone, or two or more kinds thereof may be employed simultaneously or sequentially. With regard to the stretching direction, the stretching may be performed in various directions or dimensions, such as a lengthwise direction, a widthwise direction, a thickness direction, and an oblique direction. When the glass transition temperature of the resin film is represented by Tg, the stretching temperature falls within a range of preferably from Tg−30° C. to Tg+60° C., more preferably from Tg−10° C. to Tg+50° C.

A retardation film having the desired optical characteristics (such as a refractive index characteristic, an in-plane retardation, and an Nz coefficient) can be obtained by appropriately selecting the stretching method and stretching conditions.

In one embodiment, the retardation film is produced by subjecting a resin film to uniaxial stretching or fixed-end uniaxial stretching. The fixed-end uniaxial stretching is specifically, for example, a method involving stretching the resin film in its widthwise direction (lateral direction) while running the film in its lengthwise direction. The stretching ratio is preferably from 1.1 times to 3.5 times.

In another embodiment, the retardation film may be produced by continuously subjecting a resin film having an elongate shape to oblique stretching in the direction of the angle θ with respect to a lengthwise direction. When the oblique stretching is adopted, a stretched film having an elongate shape and having an alignment angle that is the angle θ with respect to the lengthwise direction of the film (having a slow axis in the direction of the angle θ) is obtained, and for example, roll-to-roll operation can be performed in its lamination with the polarizer, with the result that the manufacturing process can be simplified. The angle θ may be an angle formed by the absorption axis of the polarizer and the slow axis of the retardation layer in the polarizing plate with a retardation layer. As described above, the angle θ is preferably from 38° to 52°, more preferably from 42° to 48°, still more preferably about 45°.

As a stretching machine to be used for the oblique stretching, for example, there is given a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the resin film having an elongate shape can be continuously subjected to the oblique stretching.

Through appropriate control of each of the speeds on the left and right sides in the stretching machine, a retardation layer (substantially a retardation film having an elongate shape) having the desired in-plane retardation and having a slow axis in the desired direction can be obtained.

The stretching temperature of the film may be changed depending on, for example, the desired in-plane retardation value and thickness of the retardation layer, the kind of the resin to be used, the thickness of the film to be used, and a stretching ratio. Specifically, the stretching temperature is preferably from Tg−30° C. to Tg+30° C., more preferably from Tg−15° C. to Tg+15° C., most preferably from Tg−10° C. to Tg+10° C. When the stretching is performed at such temperature, the first retardation layer having characteristics appropriate in the present invention can be obtained. Tg refers to the glass transition temperature of the material constituting the film.

C-3. First Retardation Layer Including Alignment Fixed Layer of Liquid Crystal Compound The first retardation layer 20 may be an alignment fixed layer of a liquid crystal compound. When the liquid crystal compound is used, the difference between nx and ny of the retardation layer to be obtained can be markedly increased as compared to a non-liquid crystal material, and hence the thickness of the retardation layer required for obtaining a desired in-plane retardation can be markedly reduced. As a result, further thinning of the polarizing plate with a retardation layer can be achieved. When the first retardation layer 20 includes the alignment fixed layer of a liquid crystal compound, its thickness is preferably from 0.5 μm to 7 μm, more preferably from 1 μm to 5 μm. When the liquid crystal compound is used, an in-plane retardation comparable to that of the resin film can be achieved with a markedly small thickness as compared to the resin film.

The term "alignment fixed layer" as used herein refers to a layer in which the liquid crystal compound is aligned in a predetermined direction and its alignment state is fixed. The "alignment fixed layer" is a concept encompassing an aligned cured layer obtained by curing a liquid crystal monomer as described later. In this embodiment, a rod-shaped liquid crystal compound is typically aligned in a state of being aligned in the slow axis direction of the first retardation layer (homogeneous alignment). An example of the liquid crystal compound is a liquid crystal compound whose liquid crystal phase is a nematic phase (nematic liquid crystal). As such liquid crystal compound, for example, a liquid crystal polymer or a liquid crystal monomer may be used. The expression mechanism of the liquid crystallinity of the liquid crystal compound may be lyotropic or thermotropic. The liquid crystal polymer and the liquid crystal monomer may be used alone or in combination thereof.

When the liquid crystal compound is the liquid crystal monomer, the liquid crystal monomer is preferably a polymerizable monomer or a cross-linkable monomer. This is because the alignment state of the liquid crystal monomer can be fixed by polymerizing or cross-linking (that is, curing) the liquid crystal monomer. After the alignment of the liquid crystal monomer, for example, when molecules of the liquid crystal monomer are polymerized or cross-linked with each other, the alignment state can be fixed as a result. In this case, a polymer is formed through the polymerization and a three-dimensional network structure is formed through the cross-linking, and the polymer and the structure are non-liquid crystalline. Therefore, the formed first retardation layer does not undergo, for example, a transition caused by a temperature change to a liquid crystal phase, a glass phase, or a crystal phase, which is peculiar to a liquid crystalline compound. As a result, the first retardation layer becomes a retardation layer that is extremely excellent in stability without being affected by a temperature change.

The temperature range in which the liquid crystal monomer shows liquid crystallinity varies depending on its kind. Specifically, the temperature range is preferably from 40° C. to 120° C., more preferably from 50° C. to 100° C., most preferably from 60° C. to 90° C.

Any appropriate liquid crystal monomer may be adopted as the liquid crystal monomer. For example, a polymerizable mesogenic compound and the like described in JP 2002-533742 A (WO 00/37585 A1), EP 358208 B1 (U.S. Pat. No. 5,211,877 A), EP 66137 B1 (U.S. Pat. No. 4,388,453 A), WO 93/22397 A1, EP 0261712 A1, DE 19504224 A1, DE 4408171 A1, GB 2280445 B, and the like may be used. Specific examples of such polymerizable mesogenic compound include a product available under the product name LC242 from BASF SE, a product available under the product name E7 from Merck KGaA, and a product available under the product name LC-Sillicon-CC3767 from Wacker Chemie AG. The liquid crystal monomer is preferably, for example, a nematic liquid crystal monomer.

The alignment fixed layer of a liquid crystal compound may be formed by: subjecting the surface of a predetermined substrate to alignment treatment; applying an application liquid containing a liquid crystal compound onto the surface; aligning the liquid crystal compound in a direction corresponding to the alignment treatment; and fixing the alignment state. In one embodiment, the substrate is any appropriate resin film, and the alignment fixed layer formed on the substrate may be transferred onto the surface of the polarizing plate 10. In another embodiment, the substrate may be another protective layer. In this case, the transfer step is eliminated, lamination can be performed by a roll-to-roll process continuously from the formation of the alignment fixed layer (first retardation layer), and hence productivity is further improved.

Any appropriate alignment treatment may be adopted as the alignment treatment. Specific examples thereof include mechanical alignment treatment, physical alignment treatment, and chemical alignment treatment. Specific examples of the mechanical alignment treatment include rubbing treatment and stretching treatment. Specific examples of the physical alignment treatment include magnetic field alignment treatment and electric field alignment treatment. Specific examples of the chemical alignment treatment include an oblique deposition method and photoalignment treatment. Any appropriate conditions may be adopted as treatment conditions for the various alignment treatments in accordance with purposes.

The alignment of the liquid crystal compound is performed through treatment at a temperature at which the liquid crystal compound shows a liquid crystal phase depending on the kind of the liquid crystal compound. When the treatment at such temperature is performed, the liquid crystal compound adopts a liquid crystal state, and the liquid crystal compound is aligned depending on the alignment treatment direction of the surface of the substrate.

In one embodiment, the fixation of the alignment state is performed by cooling the liquid crystal compound aligned as described above. When the liquid crystal compound is the polymerizable monomer or the cross-linkable monomer, the fixation of the alignment state is performed by subjecting the liquid crystal compound aligned as described above to polymerization treatment or cross-linking treatment.

Specific examples of the liquid crystal compound and details about the method of forming the alignment fixed layer are described in JP 2006-163343 A, the description of which is incorporated herein by reference.

In one embodiment, the alignment fixed layer may have a laminated structure of the first alignment fixed layer 21 and the second alignment fixed layer 22 as illustrated in FIG. 3. In this case, one of the first alignment fixed layer 21 and the second alignment fixed layer 22 may function as a λ/4 plate, and the other may function as a λ/2 plate. Therefore, the thickness of each of the first alignment fixed layer 21 and the second alignment fixed layer 22 may be adjusted so that a desired in-plane retardation of a λ/4 plate or a λ/2 plate may be obtained. For example, when the first alignment fixed layer 21 functions as a λ/4 plate, and the second alignment fixed layer 22 functions as a λ/2 plate, the thickness of the first alignment fixed layer 21 is, for example, from 0.5 μm to 2.5 μm, and the thickness of the second alignment fixed layer 22 is, for example, from 1.0 μm to 5.0 μm. The first alignment fixed layer 21 and the second alignment fixed layer 22 may be laminated so that their respective slow axes may form an angle of, for example, from 50° to 70°, preferably about 60°. In addition, the first alignment fixed layer 21 may be laminated so that its slow axis and the absorption axis of the polarizer 11 may preferably form an angle of about 15°, and the second alignment fixed layer 22 may be laminated so that its slow axis and the absorption axis of the polarizer 11 may preferably form an angle of about 75°. With such configuration, a characteristic close to an ideal reverse wavelength dispersion characteristic can be obtained, and as a result, an extremely excellent antireflection characteristic can be achieved.

D. Pressure-Sensitive Adhesive Layer

As described above, the light transmittance of the pressure-sensitive adhesive layer 30 at a wavelength of 405 nm is 5% or less, preferably 3% or less, more preferably 1% or less. When the pressure-sensitive adhesive layer 30 has such transmittance, UV light is cut off by the polarizing plate with a retardation layer in an extremely satisfactory manner. As a result, when the polarizing plate with a retardation layer is applied to an image display apparatus, extremely excellent weatherability can be achieved. Further, when a UV absorber is incorporated into the pressure-sensitive adhesive layer, weatherability based on the UV-absorbing function of the pressure-sensitive adhesive layer is secured, and hence the image display apparatus can achieve extremely excellent weatherability.

Further, the pressure-sensitive adhesive layer 30 has such light transmittances as described below: an average transmittance in the wavelength region of from 300 nm to 400 nm is preferably 5% or less, more preferably 2% or less; an average transmittance in the wavelength region of from 400 nm to 430 nm is preferably 30% or less, more preferably 20% or less; an average transmittance in the wavelength region of from 450 nm to 500 nm is preferably 70% or more, more preferably 75% or more; and an average transmittance in the wavelength region of from 500 nm to 780 nm is preferably 80% or more, more preferably 85% or more. When the average transmittance in the wavelength region of from 300 nm to 430 nm falls within the range, light that does not contribute to image display and may be responsible for the deterioration of the image display apparatus can be satisfactorily cut off. When the average transmittance in the wavelength region of from 450 nm to 780 nm falls within the range, the layer can satisfactorily transmit light that contributes to the image display (e.g., light emitted from an organic EL cell). For example, the term "average transmittance in the wavelength region of from 300 nm to 400 nm" refers to the average of transmittances calculated in the wavelength region at a pitch of 1 nm.

The haze value of the pressure-sensitive adhesive layer 30 measured at a thickness of 25 μm is preferably 2.0% or less, more preferably 1.5% or less, still more preferably 1.0% or less. The haze value is preferably as low as possible, and its lower limit is, for example, 0%. When the haze value falls within such range, a polarizing plate with a retardation layer having sufficient transparency is obtained, and as a result, an image display apparatus having excellent viewability can be obtained.

A pressure-sensitive adhesive having any appropriate configuration that may satisfy such characteristics as described above may be adopted as a pressure-sensitive adhesive (pressure-sensitive adhesive composition) forming the pressure-sensitive adhesive layer 30. The pressure-sensitive adhesive typically contains a base polymer, a UV absorber, and a dye compound whose absorption spectrum has a maximum absorption wavelength present in the wavelength region of from 380 nm to 430 nm. Herein, when a plurality of absorption maxima are present in the spectral absorption spectrum of the compound in the wavelength region of from 300 nm to 460 nm, the maximum absorption wavelength means the wavelength of the absorption maximum showing the maximum absorbance out of the maxima.

Any appropriate polymer may be used as the base polymer. The polymer is preferably a (meth)acrylic polymer. This is because the (meth)acrylic polymer is excellent in optical transparency, shows appropriate pressure-sensitive adhesive characteristics (e.g., a balance among adhesiveness, cohesiveness, and an adhesive property), and is excellent in weatherability and heat resistance. The (meth)acrylic polymer has a constituent unit derived from a (meth)acrylic acid alkyl ester as a main constituent unit forming its skeleton. The (meth)acrylic acid alkyl ester is, for example, a C1 to C20 alkyl ester of (meth) acrylic acid. The ester is preferably a (meth) acrylic acid alkyl ester having a C4 to C18, linear or branched alkyl group. The content of the constituent unit derived from the (meth)acrylic acid alkyl ester is preferably 60 parts by weight or more, more preferably 80 parts by weight or more with respect to 100 parts by weight of the base polymer.

The base polymer may contain a constituent unit derived from any other monomer component copolymerizable with the (meth) acrylic acid alkyl ester as required. Examples of such monomer component (copolymerizable component) include: carboxyl group-containing monomers, such as acrylic acid, methacrylic acid, carboxyethyl acrylate, carboxypentyl acrylate, itaconic acid, maleic acid, fumaric acid, and crotonic acid; hydroxyl group-containing monomers, such as 2-hydroxyethyl (meth)acrylate, 3-hydroxypropyl (meth)acrylate, and 4-hydroxybutyl (meth)acrylate; vinyl-based monomers, such as N-vinyl-2-pyrrolidone; acid anhydride monomers, such as maleic anhydride and itaconic anhydride; sulfonic acid group-containing monomers, such as styrenesulfonic acid and allylsulfonic acid; aromatic ring-containing alkyl (meth)acrylates, such as phenoxyethyl (meth)acrylate and benzyl (meth)acrylate; (N-substituted) amide-based monomers, such as (meth) acrylamide and N,N-dimethyl(meth)acrylamide; alkylaminoalkyl (meth) acrylate-based monomers, such as aminoethyl (meth)acrylate and N,N-dimethylaminoethyl (meth)acrylate; alkoxyalkyl (meth) acrylate-based monomers, such as methoxyethyl (meth) acrylate and ethoxyethyl (meth)acrylate; succinimide-based monomers, such as N-(meth)acryloyloxymethylene succinimide and N-acryloylmorpholine; maleimidebased monomers, such as N-cyclohexylmaleimide; and itaconimide-based monomers, such as N-methylitaconimide. Further, a vinyl-based monomer, a cyanoacrylate-based monomer, an epoxy group-containing acrylic monomer, a glycol-based acrylic ester monomer, a silane-based monomer, isoprene, butadiene, isobutylene, vinyl ether, or the like may also be used as the copolymerizable component. Besides, a polyfunctional acrylate, such as (poly)ethylene glycol di(meth)acrylate, (poly)propylene glycol di(meth) acrylate, neopentyl glycol di(meth)acrylate, pentaerythritol di(meth)acrylate, pentaerythritol tri(meth)acrylate, dipentaerythritol hexa(meth)acrylate, or hexanediol di (meth) acrylate, may also be used as the copolymerizable component. A pressure-sensitive adhesive having desired characteristics can be obtained by adjusting the kinds, combination, and compounding ratios (consequently the contents of the constituent units) of the copolymerizable components.

The weight-average molecular weight of the base polymer is preferably from 800,000 to 3,000,000, more preferably from 1,000,000 to 2,500,000, still more preferably from 1,400,000 to 2,000,000. When the weight-average molecular weight falls within such range, a pressure-sensitive adhesive layer showing an appropriate creep amount can be formed. The weight-average molecular weight is determined from values measured by gel permeation chromatography (GPC; solvent: THF) and calculated in terms of polystyrene.

Examples of the UV absorber include a triazine-based UV absorber, a benzotriazole-based UV absorber, a benzophenone-based UV absorber, an oxybenzophenone-based UV absorber, a salicylate-based UV absorber, and a cyanoacrylate-based UV absorber. Those UV absorbers may be used alone or in combination thereof. The UV absorber is preferably a triazine-based UV absorber or a benzotriazole-based UV absorber. The UV absorber is more preferably a triazine-based UV absorber having two or less hydroxyl groups in a molecule thereof, or a benzotriazole-based UV absorber having one benzotriazole skeleton in a molecule thereof. This is because each of those UV absorbers has satisfactory solubility in the monomers forming the base polymer, and has a high UV-absorbing ability at a wavelength near 380 nm.

Specific examples of the triazine-based UV absorber having two or less hydroxyl groups in a molecule thereof include 2,4-bis-[(4-(4-ethylhexyloxy)-4-hydroxy)-phenyl]-6-(4-methoxyphenyl)-1,3,5-triazine (Tinosorb S, manufactured by BASF SE), 2,4-bis[2-hydroxy-4-butoxyphenyl]-6-(2,4-dibutoxyphenyl)-1,3,5-triazine (TINUVIN 460, manufactured by BASF SE), a reaction product of 2-(4,6-bis(2,4-dimethylphenyl)-1,3,5-triazin-2-yl)-5-hydroxyphenyl and [(C10-C16 (mainly C12-C13) alkyloxy)methyl] oxirane (TINUVIN 400, manufactured by BASF SE), 2-[4,6-bis(2,4-dimethylphenyl)-1,3,5-triazin-2-yl]-5-[3-(dodecyloxy)-2-hydroxypropoxy]phenol), a reaction product of 2-(2,4-dihydroxyphenyl)-4,6-bis-(2,4-dimethyphenyl)-1,3,5-tri azine and (2-ethylhexyl)-glycidate (TINUVIN 405, manufactured by BASF SE), 2-(4,6-diphenyl-1,3,5-triazin-2-yl)-5-[(hexyl)oxy]-phenol (TINUVIN 1577, manufactured by BASF SE), 2-(4,6-diphenyl-1,3,5-triazin-2-yl)-5-[2-(2-ethylhexanoyloxy)e thoxy]-phenol (ADK STAB LA46, manufactured by ADEKA Corporation), and 2-(2-hydroxy-4-[1-octyloxycarbonylethoxy]phenyl)-4,6-bis(4-phenylphenyl)-1,3,5-triazine (TINUVIN 479, manufactured by BASF SE).

Specific examples of the benzotriazole-based UV absorber having one benzotriazole skeleton in a molecule thereof include 2-(2H-benzotriazol-2-yl)-6-(1-methyl-1-phenylethyl)-4-(1,1,3,3-tetramethylbutyl)phenol (TINUVIN 928, manufactured by BASF SE), 2-(2-hydroxy-5-tert-butylphenyl)-2H-benzotriazole (TINUVIN PS, manufactured by BASF SE), an ester compound of benzenepropanoic acid and 3-(2H-benzotriazol-2-yl)-5-(1,1-dimethylethyl)-4-hydroxy(C7-9 branched and linear alkyl) (TINUVIN 384-2, manufactured by BASF SE), 2-(2H-benzotriazol-2-yl)-4,6-bis(1-methyl-1-phenylethyl)phenol (TINUVIN 900, manufactured by BASF SE), 2-(2H-benzotriazol-2-yl)-6-(1-methyl-1-phenylethyl)-4-(1,1,3,3-tetramethylbutyl)phenol (TINUVIN 928, manufactured by BASF SE), a reaction product of methyl-3-(3-(2H-benzotriazol-2-yl)-5-t-butyl-4-hydroxyphenyl) propionate and polyethylene glycol 300 (TINUVIN 1130, manufactured by BASF SE), 2-(2H-benzotriazol-2-yl)-p-cresol (TINUVIN P, manufactured by BASF SE), 2-(2H-benzotriazol-2-yl)-4,6-bis(1-methyl-1-phenylethyl)phenol (TINUVIN 234, manufactured by BASF SE), 2-[5-chloro(2H)-benzotriazol-2-yl]-4-methyl-6-(tert-butyl)phenol (TINUVIN 326, manufactured by BASF SE), 2-(2H-benzotriazol-2-yl)-4,6-di-tert-pentylphenol (TINUVIN 328, manufactured by BASF SE), 2-(2H-benzotriazol-2-yl)-4-(1,1,3,3-tetramethylbutyl)phenol (TINUVIN 329, manufactured by BASF SE), a reaction product of methyl 3-(3-(2H-benzotriazol-2-yl)-5-tert-butyl-4-hydroxyphenyl)propionate and polyethylene glycol 300 (TINUVIN 213, manufactured by BASF SE), 2-(2H-benzotriazol-2-yl)-6-dodecyl-4-methylphenol (TINUVIN 571, manufactured by BASF SE), and 2-[2-hydroxy-3-(3,4,5,6-tetrahydrophthalimide-methyl)-5-methyl phenyl]benzotriazole (Sumisorb 250, manufactured by Sumitomo Chemical Co., Ltd.).

The maximum absorption wavelength of the absorption spectrum of the UV absorber is preferably present in the wavelength region of from 300 nm to 400 nm, and is more preferably present in the wavelength region of from 320 nm to 380 nm.

The content of the UV absorber in the pressure-sensitive adhesive layer is preferably from 0.1 part by weight to 5 parts by weight, more preferably from 0.5 part by weight to 3 parts by weight with respect to 100 parts by weight of the base polymer. When the content of the UV absorber falls within such range, the UV-absorbing ability of the pressure-sensitive adhesive layer can be made sufficient.

As described above, the maximum absorption wavelength of the absorption spectrum of the dye compound is present in the wavelength region of from 380 nm to 430 nm, and is preferably present in the wavelength region of from 380 nm to 420 nm. When such dye compound and the above-mentioned UV absorber are used in combination, an effect particularly in the case where the polarizing plate with a retardation layer is used in an organic EL display apparatus becomes significant. Specifically, the pressure-sensitive adhesive layer can sufficiently absorb light in a region (corresponding to a wavelength of from 380 nm to 430 nm) that does not affect the light emission of the organic EL cell of the organic EL display apparatus, and can sufficiently transmit light in the light-emitting region of the organic EL cell (corresponding to a wavelength longer than 430 nm), and hence the deterioration of the organic EL display apparatus due to ambient light can be suppressed while satisfactory light emission characteristics of the organic EL display apparatus are maintained. The half-width of the peak at the maximum absorption wavelength of the dye compound is preferably 80 nm or less, more preferably from 5 nm to 70 nm, still more preferably from 10 nm to 60 nm. The half-width may be measured with a spectrophotometer.

Any appropriate dye compound that may have such characteristics as described above may be adopted as the dye compound. For example, the dye compound may be an organic dye compound, or may be an inorganic dye compound. Of those, an organic dye compound is preferred. This is because the organic dye compound is excellent in dispersibility in the base polymer and in transparency. Specific examples of the organic dye compound include an azomethine-based compound, an indole-based compound, a cinnamic acid-based compound, and a porphyrin-based compound. A commercial product may be used as the dye compound. Specific examples of a commercial indole-based compound include BONASORB UA-3911 (product name, maximum absorption wavelength of its absorption spectrum: 398 nm, half-width: 48 nm, manufactured by Orient Chemical Industries Co., Ltd.), and BONASORB UA-3912 (product name, maximum absorption wavelength of its absorption spectrum: 386 nm, half-width: 53 nm, manufactured by Orient Chemical Industries Co., Ltd.). An example of a commercial cinnamic acid-based compound is SOM-5-0106 (product name, maximum absorption wavelength of its absorption spectrum: 416 nm, half-width: 50 nm, manufactured by Orient Chemical Industries Co., Ltd.). An example of a commercial porphyrin-based compound is FDB-001 (product name, maximum absorption wavelength of its absorption spectrum: 420 nm, half-width: 14 nm, manufactured by Yamada Chemical Co., Ltd.). Those dye compounds may be used alone or in combination thereof.

The content of the dye compound in the pressure-sensitive adhesive layer is preferably from 0.01 part by weight to 10 parts by weight, more preferably from 0.02 part by weight to 5 parts by weight with respect to 100 parts by weight of the base polymer. When the content of the dye compound falls within such range, an effect particularly in the case where the polarizing plate with a retardation layer is used in an organic EL display apparatus becomes significant. Specifically, the pressure-sensitive adhesive layer can more satisfactorily absorb the light in the region that does not affect the light emission of the organic EL cell of the organic EL display apparatus. As a result, the deterioration of the organic EL display apparatus due to ambient light can be more satisfactorily suppressed.

The pressure-sensitive adhesive (pressure-sensitive adhesive composition) may further contain any appropriate additive. Specific examples of the additive include a silane coupling agent, a cross-linking agent, a tackifier, a plasticizer, a pigment, a dye, a filler, an antioxidant, an age resistor, a conductive material, a light stabilizer, a release modifier, a softener, a surfactant, a flame retardant, and a polymerization initiator. The kind, combination, compounding amount, and the like of the additive may be appropriately set depending on purposes.

The thickness of the pressure-sensitive adhesive layer is preferably 50 μm or less, more preferably 30 μm or less, still more preferably 20 μm or less. The lower limit of the thickness of the pressure-sensitive adhesive layer is, for example, 10 μm. When the thickness of the pressure-sensitive adhesive layer falls within such range, the following advantage is obtained: both of the thinning of the layer, and the adhesive property and adhesion durability thereof can be achieved.

E. Second Retardation Layer

The second retardation layer 40 may have any appropriate optical characteristic in accordance with its purposes. In one embodiment, the second retardation layer may be a so-called positive C-plate whose refractive index characteristic shows a relationship of nz>nx=ny. In the case where the positive C-plate is used as the second retardation layer, reflection in an oblique direction can be satisfactorily prevented, and hence the viewing angle of the antireflection function of the polarizing plate with a retardation layer can be widened. In this case, the thickness direction retardation Rth (550) of the second retardation layer is preferably from −50 nm to −300 nm, more preferably from −70 nm to −250 nm, still more preferably from −90 nm to −200 nm, particularly preferably from −100 nm to −180 nm. Herein, "nx=ny" encompasses not only a case in which nx and ny are strictly equal to each other but also a case in which nx and ny are substantially equal to each other. That is, the in-plane retardation Re (550) of the second retardation layer may be less than 10 nm.

The second retardation layer having a refractive index characteristic of nz>nx=ny may be formed of any appropriate material. The second retardation layer is preferably formed of a film containing a liquid crystal material fixed in homeotropic alignment. The liquid crystal material (liquid crystal compound) that can be homeotropically aligned may be a liquid crystal monomer, or may be a liquid crystal polymer. The liquid crystal compound and a method of forming the retardation layer are specifically, for example, a liquid crystal compound and a method of forming the retardation layer described in paragraphs [0020] to [0028] of JP 2002-333642 A. In this case, the thickness of the second retardation layer is preferably from 0.5 μm to 10 μm, more preferably from 0.5 μm to 8 μm, still more preferably from 0.5 μm to 5 μm.

F. Conductive Layer or Isotropic Substrate with Conductive Layer

The conductive layer may be formed by forming a metal oxide film on any appropriate substrate through any appropriate film forming method (e.g., a vacuum vapor deposition method, a sputtering method, a CVD method, an ion plating method, and a spraying method). Examples of the metal oxide include indium oxide, tin oxide, zinc oxide, indium-tin composite oxide, tin-antimony composite oxide, zinc-aluminum composite oxide, and indium-zinc composite oxide. Of those, an indium-tin composite oxide (ITO) is preferred.

When the conductive layer contains the metal oxide, the thickness of the conductive layer is preferably 50 nm or less, more preferably 35 nm or less. The lower limit of the thickness of the conductive layer is preferably 10 nm.

The conductive layer may be transferred from the substrate onto the first retardation layer (or, if present, the second retardation layer) so that the conductive layer alone may serve as a layer forming the polarizing plate with a retardation layer, or the conductive layer may be laminated as a laminate of the conductive layer and the substrate (substrate with a conductive layer) on the first retardation layer (or, if present, the second retardation layer). It is preferred that the substrate be optically isotropic. Therefore, the conductive layer may be used as an isotropic substrate with a conductive layer in the polarizing plate with a retardation layer.

As the substrate that is optically isotropic (isotropic substrate), any appropriate isotropic substrate may be adopted. Examples of a material forming the isotropic substrate include: a material containing, as its main skeleton, a resin having no conjugated system, such as a norbornene-based resin or an olefin-based resin; and a material having, in the main chain of an acrylic resin, a cyclic structure, such as a lactone ring or a glutarimide ring. When any such material is used, at the time of the formation of the isotropic substrate, the expression of a retardation along with the orientation of the molecular chain of the material can be suppressed to a low level. The thickness of the isotropic substrate is preferably 50 μm or less, more preferably 35 μm or less. The lower limit of the thickness of the isotropic substrate is, for example, 20 μm.

The conductive layer and/or the conductive layer of the isotropic substrate with a conductive layer may be patterned as required. Through the patterning, a conductive part and an insulating part may be formed. As a result, an electrode may be formed. The electrode may function as a touch sensor electrode configured to sense contact with a touch panel. Any appropriate method may be adopted as a method for the patterning. Specific examples of the patterning method include a wet etching method and a screen printing method.

G. Others

A polarizing plate with a retardation layer according to an embodiment of the present invention may further include another retardation layer. The optical characteristics (such as refractive index characteristics, in-plane retardation, Nz coefficient, and photoelastic coefficient), thickness, arrangement position, and the like of the other retardation layer may be appropriately set depending on purposes.

H. Image Display Apparatus

The polarizing plate with a retardation layer described in the section A to the section G may be applied to an image display apparatus. Therefore, the present invention encompasses an image display apparatus using such polarizing plate with a retardation layer. Typical examples of the image display apparatus include a liquid crystal display apparatus and an organic EL display apparatus. An image display apparatus according to an embodiment of the present invention includes, on its viewer side, the polarizing plate with a retardation layer described in the section A to the section G. The polarizing plate with a retardation layer is laminated so that the retardation layer may be arranged on a display cell (e.g., liquid crystal cell or organic EL cell) side (so that the polarizer may be arranged on the viewer side).

EXAMPLES

Now, the present invention is specifically described by way of Examples. However, the present invention is not limited by these Examples. Measurement methods for characteristics are as described below.

(1) Thickness

The thickness of a retardation layer formed by application (alignment fixed layer of a liquid crystal compound) was measured by an interference thickness measurement method with MCPD2000 manufactured by Otsuka Electronics Co., Ltd. The thickness of any other film was measured with a digital micrometer (KC-351C manufactured by Anritsu Corporation).

(2) Light Transmittance

The light transmittances of polarizing plates with retardation layers obtained in Examples and Comparative Examples, and polarizing plates, protective layers, and pressure-sensitive adhesives used in Examples and Comparative Examples were measured with a spectrophotometer (manufactured by Hitachi, Ltd., product name: "U-4100") in conformity with JIS K0115. The light transmittances of the polarizing plates with retardation layers and the pressure-sensitive adhesives were measured at a wavelength of 405 nm, and those of the polarizing plates and the protective layers were measured at a wavelength of 380 nm.

(3) Crossed Hue Value "b"

The crossed hue values "b" of the produced polarizing plates were measured with a UV-visible spectrophotometer (V-7100 manufactured by JASCO Corporation). The two-degree field of view (C light source) of JIS Z8701 was adopted as a light source.

(4) Reflection Hue Value b*

Each of the produced polarizing plates with retardation layers was bonded onto a reflective plate with an acrylic pressure-sensitive adhesive free of any UV-absorbing function to produce a measurement sample. The reflection hue value b* of the measurement sample was measured with a spectrocolorimeter (CM-2600d manufactured by Konica Minolta, Inc.) by a SCE system. A product obtained by bonding an aluminum-deposited film (manufactured by Toray Advanced Film Co., Ltd., product name: "DMS DEPOSITED X-42", thickness: 50 μm) to a glass plate with a pressure-sensitive adhesive was used as the reflective plate.

(5) Moisture Permeability

The protective layers used in Examples and Comparative Examples were each processed into a sample having an area of 1 m$^2$, and the amount (g) of water vapor passing the sample in 24 hours in an atmosphere having a temperature of 40° C. and a humidity of 92% RH was measured in conformity with the moisture permeability test (cup method) of JIS Z0208.

Reference Example 1: Production of Retardation Film Forming Retardation Layer 1-1. Production of Polycarbonate Resin Film 26.2 Parts by mass of isosorbide (ISB), 100.5 parts by mass of 9,9-[4-(2-hydroxyethoxy)phenyl]fluorene (BHEPF), 10.7 parts by mass of 1,4-cyclohexanedimethanol (1,4-CHDM), 105.1 parts by mass of diphenyl carbonate (DPC), and 0.591 part by mass of cesium carbonate (0.2 mass % aqueous solution) serving as a catalyst were each loaded into a reaction vessel. Under a nitrogen atmosphere, as a first step of a reaction, the heating medium temperature of the reaction vessel was set to 150° C. and the raw materials were dissolved while being stirred as required (about 15 minutes).

Then, the pressure in the reaction vessel was changed from normal pressure to 13.3 kPa, and while the heating medium temperature of the reaction vessel was increased to 190° C. in 1 hour, generated phenol was taken out of the reaction vessel.

The temperature in the reaction vessel was kept at 190° C. for 15 minutes. After that, as a second step, the pressure in the reaction vessel was set to 6.67 kPa, the heating medium temperature of the reaction vessel was increased to 230° C. in 15 minutes, and generated phenol was taken out of the reaction vessel. As the stirring torque of the stirrer increased, the temperature was increased to 250° C. in 8 minutes, and in order to remove generated phenol, the pressure in the reaction vessel was reduced to 0.200 kPa or less. After the stirring torque had reached a predetermined value, the reaction was terminated, and the produced reaction product was extruded into water and then pelletized to provide a polycarbonate resin having the following composition: BHEPF/ISB/1,4-CHDM=47.4 mol %/37.1 mol %/15.5 mol %.

The resultant polycarbonate resin had a glass transition temperature of 136.6° C. and a reduced viscosity of 0.395 dL/g. The resultant polycarbonate resin was vacuum-dried at 80° C. for 5 hours, and then a polycarbonate resin film having a thickness of 120 μm was produced using a film-forming apparatus with a single-screw extruder (manufactured by Isuzu Kakoki, screw diameter: 25 mm, cylinder preset temperature: 220° C.), a T-die (width: 200 mm, preset temperature: 220° C.), a chill roll (preset temperature: 120° C. to 130° C.), and a take-up unit.

1-2. Production of Retardation Film

The polycarbonate resin film thus obtained was obliquely stretched by a method in conformity to Example 1 of JP 2014-194483 A to provide a retardation film having a thickness of 50 μm. The resultant retardation film had an Re(550) of from 137 nm to 147 nm, an Re(450)/Re(550) of 0.89, an Nz coefficient of 1.21, and an alignment angle (direction of a slow axis) of 45° with respect to an elongate direction. The retardation film was used as a retardation layer 1.

Reference Example 2: Production of Liquid Crystal Alignment Fixed Layer Forming Retardation Layer 20 Parts by weight of a side chain-type liquid crystal polymer represented by the below-indicated chemical formula (I) (numbers 65 and 35 in the formula each represent the mol % of a monomer unit, and the polymer is represented in a block polymer body for convenience: weight-average molecular weight: 5,000), 80 parts by weight of a polymerizable liquid crystal compound showing a nematic liquid crystal phase (manufactured by BASF SE: product name: Paliocolor LC242), and 5 parts by weight of a photopolymerization initiator (manufactured by Ciba Specialty Chemicals: product name: IRGACURE 907) were dissolved in 200 parts by weight of cyclopentanone. Thus, a liquid crystal application liquid was prepared. Then, the application liquid was applied to a substrate film (norbornene-based resin film: manufactured by Zeon Corporation, product name: "ZEONEX") with a bar coater, and was then heated and dried at 80° C. for 4 minutes so that the liquid crystal was aligned. UV light was applied to the liquid crystal layer to cure the liquid crystal layer. Thus, a retardation layer 2 (thickness: 1.10 μm) was formed on the substrate. The retardation layer 2 had an Re(550) of 0 nm and an Rth(550) of −135 nm, and showed a refractive index characteristic of nz>nx=ny.

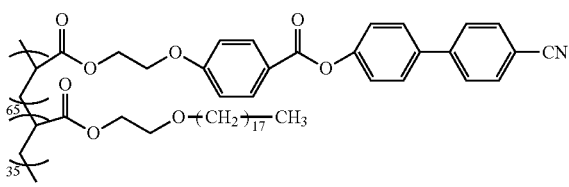
(I)

Reference Example 3: Production of Liquid Crystal Alignment Fixed Layer Forming Retardation Layer 10 g of a polymerizable liquid crystal compound showing a nematic liquid crystal phase (manufactured by BASF SE: product name: "Paliocolor LC242", represented by the below-indicated formula) and 3 g of a photopolymerization initiator for the polymerizable liquid crystal compound (manufactured by BASF SE: product name: "IRGACURE 907") were dissolved in 40 g of toluene to prepare a liquid crystal composition (application liquid).

The surface of a polyethylene terephthalate (PET) film (thickness: 38 μm) was subjected to alignment treatment by rubbing with a rubbing cloth. The alignment treatment was performed under the following conditions: the number of times of rubbing (number of rubbing rolls) was 1, the radius r of the rubbing roll was 76.89 mm, the number of rotations nr of the rubbing roll was 1,500 rpm, a film conveyance speed v was 83 mm/sec, and a rubbing strength RS and a pushing depth M were set to such five kinds of conditions (a) to (e) as shown in Table 1.

TABLE 1

|  | Rubbing strength RS (mm) | Pushing depth M (mm) |
|---|---|---|
| Condition (a) | 2,618 | 0.3 |
| Condition (b) | 3,491 | 0.4 |
| Condition (c) | 4,363 | 0.5 |
| Condition (d) | 1,745 | 0.2 |
| Condition (e) | 873 | 0.1 |

The direction of the alignment treatment was set so as to be a direction of −75° with respect to the direction of the absorption axis of a polarizer as seen from a viewer side in bonding to a polarizing plate. The liquid crystal application liquid was applied to the alignment-treated surface with a bar coater, and was dried by heating at 90° C. for 2 minutes to align the liquid crystal compound. Under the conditions (a) to (c), the alignment state of the liquid crystal compound was extremely satisfactory. Under the conditions (d) and (e), a slight disturbance occurred in the alignment of the liquid crystal compound, but was at such a level as not to cause any problem in practical use. Light was applied in an irradiance of 1 mJ/cm² to the thus-formed liquid crystal layer with a metal halide lamp to cure the liquid crystal layer. Thus, a retardation layer (liquid crystal alignment fixed layer) 3 was formed on the PET film. The retardation layer 3 had a thickness of 2 μm and an in-plane retardation Re(550) of 270 nm. Further, the retardation layer 3 had a refractive index distribution of nx>ny=nz.

Reference Example 4: Production of Liquid Crystal Alignment Fixed Layer Forming Retardation Layer The surface of a polyethylene terephthalate (PET) film (thickness: 38 μm) was subjected to alignment treatment by rubbing with a rubbing cloth. The direction of the alignment treatment was set so as to be a direction of −15° with respect to the direction of the absorption axis of a polarizer as seen from a viewer side in bonding to a polarizing plate. The same liquid crystal application liquid as that of Reference Example 3 was applied to the alignment-treated surface, and the liquid crystal compound was aligned and cured in the same manner as in Reference Example 3 to form a retardation layer 4 on the PET film. The retardation layer 4 had a thickness of 1.2 μm and an in-plane retardation Re(550) of 140 nm. Further, the retardation layer 4 had a refractive index distribution of nx>ny=nz.

Reference Example 5: Production of Pressure-Sensitive Adhesive Layer

A monomer mixture including 78 parts by weight of 2-ethylhexyl acrylate (2EHA), 18 parts by weight of N-vi-

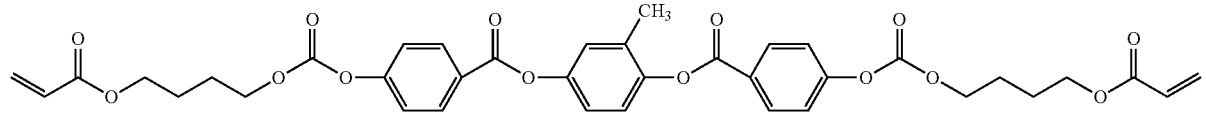 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

nyl-2-pyrrolidone (NVP), and 15 parts by weight of 2-hydroxyethyl acrylate (HEA) was compounded with 0.035 part by weight of 1-hydroxycyclohexyl phenyl ketone (product name: IRGACURE 184, having an absorption band in the wavelength range of from 200 nm to 370 nm, manufactured by BASF SE) and 0.035 part by weight of 2,2-dimethoxy-1,2-diphenylethan-1-one (product name: IRGACURE 651, having an absorption band in the wavelength range of from 200 nm to 380 nm, manufactured by BASF SE) serving as photopolymerization initiators. After that, the resultant was irradiated with UV light until its viscosity (measurement conditions: a BH viscometer, a No. 5 rotor, 10 rpm, and a measurement temperature of 30° C.) became about 20 Pa·s. Thus, a prepolymer composition (polymerization ratio: 8%) in which part of the monomer components polymerized was obtained. Next, 0.15 part by weight of hexanediol diacrylate (HDDA) and 0.3 part by weight of a silane coupling agent (product name: KBM-403, manufactured by Shin-Etsu Chemical Co., Ltd.) were added to and mixed in the prepolymer composition. Thus, an acrylic pressure-sensitive adhesive composition "a" was obtained.

0.7 Part by weight (solid content weight) of 2,4-bis-[{(4-(4-ethylhexyloxy)-4-hydroxy}-phenyl]-6-(4-methoxyphenyl)-1,3,5-triazine (UV absorber, product name: "Tinosorb S", maximum absorption wavelength of its absorption spectrum: 346 nm, manufactured by BASF Japan Ltd.) dissolved in butyl acrylate so that its solid content became 15%, 0.3 part by weight of bis(2,4,6-trimethylbenzoyl)-phenylphosphine oxide (product name: IRGACURE 819, having an absorption band in the wavelength range of from 200 nm to 450 nm, manufactured by BASF Japan Ltd.), and 0.5 part by weight (solid content weight) of an indole-based compound (dye compound, product name: "BONASORB UA-3911", maximum absorption wavelength of its absorption spectrum: 398 nm, half-width: 48 nm, manufactured by Orient Chemical Industries Co., Ltd.) dissolved in N-vinyl-2-pyrrolidone (NVP) so that its solid content became 5% were added to the resultant acrylic pressure-sensitive adhesive composition "a", and the mixture was stirred to provide a pressure-sensitive adhesive composition A.

The resultant pressure-sensitive adhesive composition A was applied onto the release-treated surface of a release film so that its thickness after the formation of a pressure-sensitive adhesive layer became 15 µm. Next, another release film was bonded to the surface of the applied layer. After that, UV irradiation was performed under the conditions of an illuminance of 6.5 mW/cm, a light quantity of 1,500 mJ/cm$^2$, and a peak wavelength of 350 nm to photocure the applied layer. Thus, a pressure-sensitive adhesive layer 1 was formed.

Example 1

1. Production of Polarizer

An amorphous polyethylene terephthalate (A-PET) film (manufactured by Mitsubishi Plastics, Inc., product name: NOVACLEAR SH046, thickness: 200 µm) was prepared as a substrate, and its surface was subjected to corona treatment (58 W/m$^2$/min). Meanwhile, PVA (polymerization degree: 4,200, saponification degree: 99.2%) having added thereto 1 wt % of acetoacetyl-modified PVA (manufactured by the Nippon Synthetic Chemical Industry Co. Ltd., product name: Gohsefimer Z200, polymerization degree: 1,200, saponification degree: 99.0% or more, acetoacetyl modification degree: 4.6%) was prepared, and applied so as to have a film thickness after drying of 12 µm, followed by drying under a 60° C. atmosphere by hot-air drying for 10 minutes to produce a laminate in which a PVA-based resin layer was formed on the substrate. Then, the laminate was first stretched in air at 130° C. at a ratio of 2.0 times to provide a stretched laminate. Next, there was performed a step of insolubilizing the PVA-based resin layer containing aligned PVA molecules included in the stretched laminate by immersing the stretched laminate in an insolubilizing aqueous solution of boric acid having a liquid temperature of 30° C. for 30 seconds. In the insolubilizing aqueous solution of boric acid of this step, the boric acid content was set to 3 wt % with respect to 100 wt % of water. The resultant stretched laminate was dyed to produce a colored laminate. The colored laminate is a product obtained by immersing the stretched laminate in a dyeing liquid having a liquid temperature of 30° C. and containing iodine and potassium iodide, to thereby adsorb iodine onto the PVA-based resin layer included in the stretched laminate. An iodine concentration and an immersion time were adjusted so that the polarizer to be obtained had a single layer transmittance of 44.5%. Specifically, in the dyeing liquid, water was used as a solvent, the iodine concentration was set to fall within the range of from 0.08 wt % to 0.25 wt %, and the potassium iodide concentration was set to fall within the range of from 0.56 wt % to 1.75 wt %. A ratio between the concentrations of iodine and potassium iodide was 1 to 7. Next, there was performed a step of subjecting the PVA molecules of the PVA-based resin layer onto which iodine had been adsorbed to cross-linking treatment by immersing the colored laminate in a cross-linking aqueous solution of boric acid at 30° C. for 60 seconds. In the cross-linking aqueous solution of boric acid of this step, the boric acid content was set to 3 wt % with respect to 100 wt % of water, and the potassium iodide content was set to 3 wt % with respect to 100 wt % of water. Further, the resultant colored laminate was stretched in an aqueous solution of boric acid at a stretching temperature of 70° C. at a ratio of 2.7 times in the same direction as that of the stretching in the air, resulting in a final stretching ratio of 5.4 times. Thus, a laminate of "substrate/polarizer" was obtained. In the cross-linking aqueous solution of boric acid of this step, the boric acid content was set to 6.5 wt % with respect to 100 wt % of water, and the potassium iodide content was set to 5 wt % with respect to 100 wt % of water. The resultant laminate was taken out from the aqueous solution of boric acid, and boric acid adhering to the surface of the polarizer was washed off with an aqueous solution having a potassium iodide content of 2 wt % with respect to 100 wt % of water. The washed laminate was dried with warm air at 60° C. The thickness of the polarizer was 5 µm.

2. Production of Polarizing Plate with Retardation Layer

Onto the polarizer surface of the laminate of "substrate/polarizer" obtained in the foregoing, the retardation layer 1 obtained in Reference Example 1 was bonded via a PVA-based adhesive. In this case, the bonding was performed so that the absorption axis of the polarizer and the slow axis of the retardation layer formed an angle of 45°. The retardation layer 2 obtained in Reference Example 2 was transferred onto the surface of the retardation layer 1. Further, the A-PET film that was the substrate was peeled from the laminate, and a cycloolefin-based film (manufactured by Zeon Corporation, product name: "ZEONOR FILM", product number: "ZF12-025-1300U", three-layer laminate of "outer layer/inner layer/outer layer", thickness: 23 µm, light transmittance at 380 nm: 8.7%) was bonded to the peeled surface via a PVA-based adhesive. Further, one release film was peeled from the laminate of "release film/pressure-sensitive adhesive layer 1/release film" obtained in Reference Example 5, and the pressure-sensitive adhesive layer 1 was bonded to the surface of the retardation layer 2. Thus, a polarizing plate 1 with a retardation layer having a configuration of "protective layer/polarizer/first retardation layer/second retardation layer/pressure-sensitive adhesive layer" was obtained.

3. Production of Organic EL Display Apparatus

The polarizing plate 1 with a retardation layer obtained in the foregoing was cut into dimensions measuring 50 mm by 50 mm. Meanwhile, a smartphone (Galaxy-S5) manufactured by Samsung Electronics Co., Ltd. was disassembled, and an organic EL display apparatus was removed. A polarizing film bonded to the organic EL display apparatus was peeled off, and the polarizing plate 1 with a retardation layer cut in the foregoing was bonded instead to the residue. Thus, an organic EL display apparatus 1 was obtained. The resultant organic EL display apparatus 1 was subjected to the evaluations of its weatherability and hue. The results are shown in Table 2. Specifically, the evaluations were performed as described below.

As the weatherability evaluation, a test in which the resultant organic EL display apparatus 1 was stored in an apparatus "Super Xenon Fade Meter" manufactured by Suga Test Instruments Co., Ltd. for 220 hours was performed, and a brightness (Y value) at the time of white display in a state in which the polarizing film was peeled after the test was measured, followed by its comparison to a brightness before the test. A spectroradiometer "SR-UL1R" manufactured by Topcon Technohouse Corporation was used in brightness measurement.

As the hue evaluation, the hue of the resultant organic EL display apparatus at the time of white display was evaluated with a spectroradiometer "SR-UL1R" manufactured by Topcon Technohouse Corporation.

Example 2

A polarizing plate 2 with a retardation layer and an organic EL display apparatus 2 were produced in the same manner as in Example 1 except that the retardation layers 3 and 4 were used instead of the retardation layers 1 and 2. The resultant organic EL display apparatus 2 was subjected to the same evaluations as those of Example 1. The results are shown in Table 2.

Comparative Example 1

1. Production of Polarizing Plate

An elongate roll of a polyvinyl alcohol (PVA)-based resin film having a thickness of 30 µm (manufactured by Kuraray Co., Ltd., product name: "PE3000") was uniaxially stretched in an elongate direction with a roll stretching machine at a ratio of 5.9 times in the elongate direction, and at the same time, was subjected to swelling, dyeing, cross-linking, and washing treatments, followed finally by drying treatment. Thus, a polarizer C1 having a thickness of 12 µm was produced.

Specifically, in the swelling treatment, the film was stretched at a ratio of 2.2 times while being treated with pure water at 20° C. Then, in the dyeing treatment, the film was stretched at a ratio of 1.4 times while being treated in an aqueous solution at 30° C. containing iodine and potassium iodide at a weight ratio of 1:7, whose iodine concentration had been adjusted so that the polarizer to be obtained had a single layer transmittance of 45.0%. Further, two-stage cross-linking treatment was adopted for the cross-linking treatment. In the first-stage cross-linking treatment, the film was stretched at a ratio of 1.2 times while being treated in an aqueous solution at 40° C. having dissolved therein boric acid and potassium iodide. The boric acid content and potassium iodide content of the aqueous solution of the first-stage cross-linking treatment were set to 5.0 wt % and 3.0 wt %, respectively. In the second-stage cross-linking treatment, the film was stretched at a ratio of 1.6 times while being treated in an aqueous solution at 65° C. having dissolved therein boric acid and potassium iodide. The boric acid content and potassium iodide content of the aqueous solution of the second-stage cross-linking treatment were set to 4.3 wt % and 5.0 wt %, respectively. In addition, in the washing treatment, the film was treated in an aqueous solution of potassium iodide at 20° C. The potassium iodide content of the aqueous solution of the washing treatment was set to 2.6 wt %. Finally, the film was dried by the drying treatment at 70° C. for 5 minutes. Thus, a polarizer C1 was obtained.

Onto both surfaces of the resultant polarizer C1, via a polyvinyl alcohol-based adhesive, a TAC film manufactured by Konica Minolta, Inc. (product name: KC2UA, thickness: 25 µm, corresponding to the other protective layer) and a HC-TAC film (thickness: 32 µm, corresponding to the protective layer) having a hard coat (HC) layer formed through hard coat treatment on one surface of the TAC film were bonded, respectively. Thus, a polarizing plate C1 having a configuration of "protective layer/polarizer C1/other protective layer" was obtained.

2. Production of Polarizing Plate with Retardation Layer and Organic EL Display Apparatus The retardation layer 1 was bonded to the surface of the other protective layer of the polarizing plate C1 via a usual acrylic pressure-sensitive adhesive (thickness: 12 µm). Further, a usual acrylic pressure-sensitive adhesive (thickness: 15 µm) was bonded to the surface of the retardation layer 1. Thus, a polarizing plate C1 with a retardation layer having a configuration of "protective layer/polarizer/other protective layer/usual pressure-sensitive adhesive layer/retardation layer/usual pressure-sensitive adhesive layer" was obtained. Herein, the usual pressure-sensitive adhesive layer refers to a pressure-sensitive adhesive layer free of any UV-absorbing ability.

An organic EL display apparatus C1 was produced in the same manner as in Example 1 except that the polarizing plate C1 with a retardation layer was used. The resultant organic EL display apparatus C1 was subjected to the same evaluations as those of Example 1. The results are shown in Table 2.

Comparative Example 2

A polarizing plate C2 with a retardation layer was obtained in the same manner as in Example 1 except that a usual acrylic pressure-sensitive adhesive was used. An organic EL display apparatus C2 was produced in the same manner as in Example 1 except that the polarizing plate C2 with a retardation layer was used. The resultant organic EL display apparatus C2 was subjected to the same evaluations as those of Example 1. The results are shown in Table 2.

Comparative Example 3

A polarizing plate C3 with a retardation layer including the pressure-sensitive adhesive layer 1 was obtained in the same manner as in Example 1 except that a film (manufactured by Zeon Corporation, product name: "ZEONOR FILM", product number: "ZF14-013-1330", thickness: 13 µm, light transmittance at 380 nm: 90.0%) was used as a cycloolefin-based film. An organic EL display apparatus C3 was produced in the same manner as in Example 1 except that the polarizing plate C3 with a retardation layer was used. The resultant organic EL display apparatus C3 was subjected to the same evaluations as those of Example 1. The results are shown in Table 2.

TABLE 2

|  |  | Example 1 | Example 2 | Comparative Example 1 | Comparative Example 2 | Comparative Example 3 |
|---|---|---|---|---|---|---|
| Polarizer | Thickness (μm) | 5 | 5 | 12 | 5 | 5 |
|  | Crossed hue value "b" (NBS) | −1.5 | −2.5 | −8.2 | −1.5 | −1.5 |
| Protective layer | Thickness (μm) | 23 | 23 | 32 | 23 | 13 |
|  | Light transmittance at 380 nm (%) | 8.7 | 8.7 | 20.2 | 8.7 | 90.0 |
|  | Moisture permeability (g/m² · 24 h) | 12 | 12 | 100 to 200 | 12 | 20 |
| Polarizing plate | Light transmittance at 380 nm (%) | 2.0 | 2.5 | 4.4 | 2.0 | 35.0 |
| Pressure-sensitive adhesive layer | Light transmittance at 405 nm (%) | 1.5 | 1.5 | 91.4 | 91.4 | 1.5 |
| Polarizing plate with retardation layer (including pressure-sensitive adhesive) | Light transmittance at 405 nm (%) | 0.4 | 0.4 | 36.0 | 33.2 | 0.6 |
| Polarizing plate with retardation layer (free of pressure-sensitive adhesive) | Reflection hue value b* | −4.6 | −1.9 | −10.7 | −4.6 | −4.6 |
| Organic EL display apparatus | Weatherability ΔY (%) | −2 | −4 | −81 | −32 | −47 |
|  | Hue (x, y) | 0.30, 0.32 | 0.30, 0.32 | 0.30, 0.32 | 0.30, 0.31 | 0.30, 3.32 |

<Evaluation>

As is apparent from Table 2, according to Examples of the present invention, when the light transmittance of the protective layer at a wavelength of 380 nm, the light transmittance of the polarizing plate at a wavelength of 380 nm, the light transmittance of the pressure-sensitive adhesive layer at a wavelength of 405 nm, and the light transmittance of the polarizing plate with a retardation layer at a wavelength of 405 nm are set within predetermined ranges in combination, the weatherability can be significantly improved while a desired hue is maintained.

INDUSTRIAL APPLICABILITY

The polarizing plate with a retardation layer of the present invention is suitably used in an image display apparatus, such as a liquid crystal display apparatus or an organic EL display apparatus.

REFERENCE SIGNS LIST 10 polarizing plate
11 polarizer
12 protective layer
20 retardation layer (first retardation layer)
21 first alignment fixed layer
22 second alignment fixed layer
30 pressure-sensitive adhesive layer
40 another retardation layer (second retardation layer)
100 polarizing plate with a retardation layer
101 polarizing plate with a retardation layer
102 polarizing plate with a retardation layer

The invention claimed is:

1. A polarizing laminate, comprising in this order:
    a polarizing plate including a protective layer and a polarizer;
    a retardation layer; and
    a pressure-sensitive adhesive layer;
    a conductive layer or an isotropic substrate with a conductive layer between the retardation layer and the pressure-sensitive adhesive layer,
    wherein the protective layer has a light transmittance at a wavelength of 380 nm of 10% or less,
    wherein the polarizing plate has a light transmittance at a wavelength of 380 nm of 5% or less,
    wherein the pressure-sensitive adhesive layer has a light transmittance at a wavelength of 405 nm of 5% or less, and
    wherein the polarizing laminate has a light transmittance at a wavelength of 405 nm of 3% or less.

2. The polarizing laminate according to claim 1, wherein the retardation layer comprises a polycarbonate-based resin film.

3. The polarizing laminate according to claim 2, further comprising another retardation layer between the retardation layer and the pressure-sensitive adhesive layer.

4. The polarizing laminate according to claim 1, wherein the retardation layer comprises an alignment fixed layer of a liquid crystal compound.

5. The polarizing laminate according to claim 4, wherein the retardation layer has a laminated structure of a first alignment fixed layer of a liquid crystal compound and a second alignment fixed layer of a liquid crystal compound.

6. The polarizing laminate according to claim 1, wherein the polarizer has a thickness of 10 μm or less.

7. The polarizing laminate according to claim 1, wherein the protective layer has a thickness of 30 μm or less.

8. The polarizing laminate according to claim 7, wherein the protective layer has a moisture permeability of 20 g/m²·24 h or less.

9. The polarizing laminate according to claim 1, wherein the polarizing plate and the retardation layer are directly laminated.

10. The polarizing laminate according to claim 1, wherein the polarizing plate has a reflection hue value b* of −1.5 or less.

11. The polarizing laminate according to claim 1, wherein the polarizer has a crossed hue value "b" of −1.5 or less.

12. An image display apparatus, comprising the polarizing laminate of claim 1.

13. A polarizing laminate, comprising in this order:
a polarizing plate including a protective layer and a polarizer;
a retardation layer;
another retardation layer; and
a pressure-sensitive adhesive layer,
wherein the retardation layer comprises a polycarbonate-based resin film, has a refractive index characteristics of nx>ny≥nz, has an Re(550) of from 80 nm to 200 nm, and has an Re(450)/Re(550) of 0.8 or more and less than 1,
wherein the another retardation layer has a refractive index characteristics of nz>nx=ny,
wherein an angle formed by a slow axis of the retardation layer and an absorption axis of the polarizer is from 38° to 52°,
wherein the protective layer is a laminate having an inner layer having a UV-absorbing ability and outer layers arranged on both sides of the inner layer, has a light transmittance at a wavelength of 380 nm of 10% or less, and has a moisture permeability of 20 g/m²·24 h or less,
wherein the pressure-sensitive adhesive layer contains a UV absorber, and a dye compound whose absorption spectrum has a maximum absorption wavelength present in the wavelength region of from 380 nm to 430 nm, and has a light transmittance at a wavelength of 405 nm of 5% or less,
wherein the polarizing plate has a light transmittance at a wavelength of 380 nm of 5% or less, and
wherein the polarizing laminate has a light transmittance at a wavelength of 405 nm of 3% or less.

14. A polarizing laminate, comprising in this order:
a polarizing plate including a protective layer and a polarizer;
a retardation layer; and
a pressure-sensitive adhesive layer,
wherein the retardation layer has a laminated structure of a first alignment fixed layer of a liquid crystal compound and a second alignment fixed layer of a liquid crystal compound, one of the first alignment fixed layer and the second alignment fixed layer functions as a λ/4 plate, and the other functions as a λ/2 plate,
wherein an angle formed by a slow axis of the first alignment fixed layer and an absorption axis of the polarizer is about 15°, and an angle formed by a slow axis of the second alignment fixed layer and the absorption axis of the polarizer is about 75°,
wherein the protective layer is a laminate having an inner layer having a UV-absorbing ability and outer layers arranged on both sides of the inner layer, has a light transmittance at a wavelength of 380 nm of 10% or less, and has a moisture permeability of 20 g/m²·24 h or less,
wherein the pressure-sensitive adhesive layer contains a UV absorber, and a dye compound whose absorption spectrum has a maximum absorption wavelength present in the wavelength region of from 380 nm to 430 nm, and has a light transmittance at a wavelength of 405 nm of 5% or less,
wherein the polarizing plate has a light transmittance at a wavelength of 380 nm of 5% or less, and
wherein the polarizing laminate has a light transmittance at a wavelength of 405 nm of 3% or less.

* * * * *